(12) United States Patent
Yeke Yazdandoost et al.

(10) Patent No.: US 12,189,902 B2
(45) Date of Patent: Jan. 7, 2025

(54) PHOTO-SENSING ENABLED DISPLAY FOR TOUCH DETECTION WITH CUSTOMIZED PHOTODIODE AND LIGHT EMITTING DIODE COMPONENT LEVEL ANGULAR RESPONSE

(71) Applicant: Apple Inc., Cupertino, CA (US)

(72) Inventors: Mohammad Yeke Yazdandoost, Foster City, CA (US); Paul J. Gelsinger, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/411,907

(22) Filed: Jan. 12, 2024

(65) Prior Publication Data
US 2024/0310959 A1  Sep. 19, 2024

Related U.S. Application Data

(60) Provisional application No. 63/583,846, filed on Sep. 19, 2023, provisional application No. 63/480,465, filed on Jan. 18, 2023.

(51) Int. Cl.
*G06F 3/041* (2006.01)
*G06F 3/042* (2006.01)
*H01L 25/16* (2023.01)

(52) U.S. Cl.
CPC ........ *G06F 3/04186* (2019.05); *G06F 3/0421* (2013.01); *H01L 25/167* (2013.01); *G06F 2203/04109* (2013.01)

(58) Field of Classification Search
CPC .................................................. G06F 3/04186
See application file for complete search history.

(56) References Cited

U.S. PATENT DOCUMENTS

| | | | |
|---|---|---|---|
| 8,345,023 B1 | 1/2013 | Drennan et al. | |
| 9,158,416 B2* | 10/2015 | Eriksson | G06F 1/1643 |
| 9,218,073 B1* | 12/2015 | Kremin | G06F 3/0442 |
| 9,501,176 B1 | 11/2016 | Smits | |
| 9,582,117 B2 | 2/2017 | Wyrwas et al. | |
| 9,844,704 B2 | 12/2017 | Thurman et al. | |
| 9,964,439 B2 | 5/2018 | Arends et al. | |
| 10,365,732 B2 | 7/2019 | Bernstein et al. | |

(Continued)

FOREIGN PATENT DOCUMENTS

CA  2340723 A1  3/2000

*Primary Examiner* — Chun-Nan Lin
(74) *Attorney, Agent, or Firm* — Kubota & Basol LLP

(57) ABSTRACT

An electronic device may have a touch sensitive display with optical touch sensors that are insensitive to the presence of moisture. The optical touch sensors may include light sources and light detectors. Light illuminator and detector angular filters (e.g., masks, baffles) can be employed to limit the illumination and receive angles of emitted and detected light to minimize false object detection. In some examples, light illuminator and detector masks and baffles can be formed during the photodiode component fabrication process. Interference filters may be included over the light sources and/or the light detectors to improve discrimination between a user's finger and water, and may have a greater transmission for light at a first incident angle that is greater than the critical angle of the water/cover interface than at a second incident angle that is less than the critical angle.

20 Claims, 22 Drawing Sheets

(56) References Cited

U.S. PATENT DOCUMENTS

| | | |
|---|---|---|
| 10,908,710 B2 | 2/2021 | Kremin et al. |
| 11,301,089 B2 | 4/2022 | Christiansson et al. |
| 11,755,107 B1* | 9/2023 | Cihan ................... G06F 3/017 |
| | | 345/156 |
| 2005/0026209 A1* | 2/2005 | Vann ................... G01N 21/648 |
| | | 385/115 |
| 2012/0127110 A1 | 5/2012 | Amm et al. |
| 2013/0069913 A1* | 3/2013 | Wang ................... G06F 3/0421 |
| | | 345/175 |
| 2013/0321345 A1* | 12/2013 | Burns ................. G02B 6/0036 |
| | | 29/622 |
| 2015/0091875 A1* | 4/2015 | Li ......................... G01B 11/14 |
| | | 385/13 |
| 2017/0024083 A1* | 1/2017 | Gilton ................. G06F 3/0412 |
| 2017/0123595 A1* | 5/2017 | Zou ...................... G06F 3/0428 |
| 2017/0139498 A1* | 5/2017 | Zou ...................... G06F 3/0421 |
| 2018/0239445 A1 | 8/2018 | Barel |
| 2020/0249777 A1* | 8/2020 | Hou ...................... G06F 3/042 |
| 2020/0310592 A1* | 10/2020 | Bergström ............ G06F 3/0421 |
| 2021/0311585 A1* | 10/2021 | Duxbury ............... G06F 3/0428 |
| 2021/0311586 A1* | 10/2021 | Duxbury ............... G06F 3/0428 |
| 2021/0349326 A1 | 11/2021 | Peng et al. |
| 2022/0027034 A1 | 1/2022 | Park et al. |
| 2022/0113542 A1* | 4/2022 | Pappas ................. G06T 19/006 |

\* cited by examiner

PHOTO-SENSING ENABLED DISPLAY FOR TOUCH DETECTION WITH CUSTOMIZED PHOTODIODE AND LIGHT EMITTING DIODE COMPONENT LEVEL ANGULAR RESPONSE

CROSS-REFERENCE TO RELATED APPLICATIONS

This application claims the benefit of U.S. Provisional Application No. 63/480,465, filed Jan. 18, 2023, and U.S. Provisional Application No. 63/583,846, filed Sep. 19, 2023, the contents of which are herein incorporated by reference in their entireties for all purposes.

FIELD OF THE DISCLOSURE

This relates generally to electronic devices, and, more particularly, to electronic devices with optical touch sensors.

BACKGROUND OF THE DISCLOSURE

Many types of input devices are presently available for performing operations in an electronic device having a computing system, such as buttons or keys, mice, trackballs, and joysticks. In addition, electronic devices such as tablet computers, cellular telephones, and other equipment are often provided with touch sensors. For example, displays in electronic devices are often provided with touch sensors to receive touch input; the combination of a display and touch sensors is referred to herein as a touch screen. Touch screens are popular because of their case and versatility of operation as well as their declining price. Touch screens can include a touch sensor panel, which can be a clear panel with a touch-sensitive surface, and a display device such as a liquid crystal display (LCD), light emitting diode (LED) display, micro-LED display, or organic light emitting diode (OLED) display that can be positioned partially or fully behind the touch sensor panel, or integrated with the touch sensor panel, so that the touch-sensitive surface can cover at least a portion of the viewable area of the display device. Touch screens can allow a user to perform various functions by touching the touch sensor panel using a finger or other object at a location often dictated by a user interface (UI) being displayed by the display device.

In some embodiments, optical touch sensing can be employed in the touch sensor panel to detect the presence of a finger or other object in contact with a detection surface. However, when optical sensing is employed, light impinging on the boundary between the detection surface and a medium (e.g., air, water, or other liquid or moisture) above the detection surface can reflect off the boundary, or refract as it passes through the boundary, and cause false or inaccurate touch detection. It can therefore be challenging to utilize optical sensing for touch detection in the presence of moisture.

SUMMARY OF THE DISCLOSURE

An electronic device may have a touch sensitive display that is insensitive to the presence of moisture. The display may have a two-dimensional optical touch sensor such as a direct illumination optical touch sensor or a total internal reflection touch sensor. The optical touch sensor may be used to gather touch input not only in benign conditions (e.g., in the absence of water or other moisture), but also while the electronic device is immersed in water or otherwise exposed to moisture.

An array of pixels in the display may be used to display images. A display cover layer may overlap the array of pixels. One or more light sources may be included to illuminate an external object such as a finger of a user or a stylus when the object contacts a surface of the display cover layer. This creates scattered light that may be detected by an array of light sensors. The light sources and the light sensors may be mounted on a common substrate with the array of image pixels (which may be formed by crystalline semiconductor light-emitting diode dies).

In some embodiments, the light sensors (light detectors) and light sources can include photodiodes and light emitting diodes (LEDs) (e.g., standard LEDs, organic LEDs (OLEDs), micro-LEDs and the like). The LEDs and photodiodes can be configured in a direct illumination optical reflective touch mode to detect the presence of an object such as a finger or stylus by detecting modulated light generated by some of the LEDs and reflected off the object.

In some examples, interference filters may be included over the light sources and/or the light detectors to improve discrimination between a user's finger and water droplets. An interface between air and the display cover layer is characterized by a first critical angle. An interface between water and the display cover layer is characterized by a second critical angle. The interference filters over the light sources may have a greater transmission for light at the wavelength of interest (such as near-infrared light) at a first incident angle that is less than the first critical angle than at a second incident angle that is greater than the first critical angle. The interference filters over the light detectors may have a greater transmission for light at the wavelength of interest (such as near-infrared light) at a first incident angle that is greater than the second critical angle than at a second incident angle that is less than the second critical angle.

Direct illumination optical touch sensors and total internal reflection touch sensors both rely on light passing through the detection surface of a cover material located above the integrated touch screen to photodiodes located below the cover material. However, light impinging on the boundary between the detection surface and a medium above the detection surface (e.g., air, water, finger, or stylus), from either above or below the detection surface, can reflect off the boundary or be refracted as it passes through the boundary. In some instances, this reflected or refracted light can be detected and incorrectly identified as a touching object. Accordingly, in some embodiments of the disclosure, light illuminator angular filters can be employed within each LED component configured as an illuminator to limit the illumination angle of those illuminators, and light detector angular filters can be employed within each photodiode component configured as a detector to limit the detection angle of those detectors. Each angular filter acts as mask, including an inner mask baffle and an outer mask, that together effectively block or filter light transmitted, reflected or refracted within the cover material to facilitate a customized angular response that reduces or eliminates the false detection of water droplets on the touch surface.

Forming the inner mask baffle and the outer mask at the photodiode component level, during the fabrication of the photodiode component, can provide several advantages. By doing so, the process of forming the inner mask baffle and the outer mask can be isolated from the display assembly process, and the baffle and mask become part of the modularized photodiode component, thereby casing the challenges of forming the baffle and mask at a higher level of integration. Forming the inner mask baffle and outer mask within the photodiode component also miniaturizes the baffle and mask to produce a smaller footprint, and in some instances component-level fabrication processes can enable formation of the baffle and mask with greater accuracy than at the display assembly level. In contrast, forming the inner mask baffle and outer mask at a higher level of integration, such as at the display assembly level, requires that the baffle and mask be formed at a greater height above the photosensitive surface of the photodiode as compared to the photodiode component level, which in turn requires that the baffle and mask be larger and consume more display surface area.

DETAILED DESCRIPTION

Figure 1:
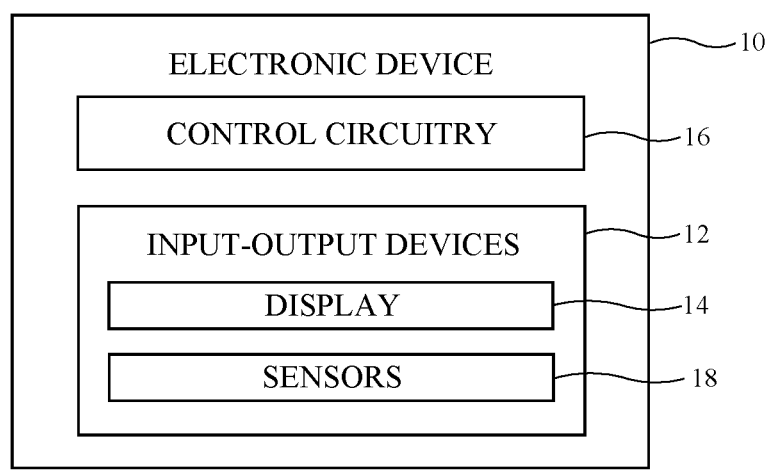
FIG. 1 is a schematic diagram of an illustrative electronic device in accordance with some embodiments of the disclosure.

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

An electronic device may have a touch sensitive display that is insensitive to the presence of moisture. The electronic device can include a mobile telephone, a tablet computer, a wearable device (e.g., a watch), a personal computer, a digital media player, a smart speaker, and the like. The display may have a two-dimensional optical touch sensor such as a direct illumination optical touch sensor or a total internal reflection touch sensor. The optical touch sensor may be used to gather touch input not only in benign conditions (e.g., in the absence of water or other moisture), but also while the electronic device is immersed in water or otherwise exposed to moisture.

An array of pixels in the display may be used to display images. A display cover layer may overlap the array of pixels. One or more light sources may be included to illuminate an external object such as a finger of a user or a stylus when the object contacts a surface of the display cover layer. This creates scattered light that may be detected by an array of light sensors. The light sources and the light sensors may be mounted on a common substrate with the array of image pixels (which may be formed by crystalline semiconductor light-emitting diode dies).

In some embodiments, the light sensors (light detectors) and light sources can include photodiodes and light emitting diodes (LEDs) (e.g., standard LEDs, organic LEDs (OLEDs), micro-LEDs and the like). The LEDs and photodiodes can be configured in a direct illumination optical reflective touch mode to detect the presence of an object such as a finger or stylus by detecting modulated light generated by some of the LEDs and reflected off the object.

In some examples, interference filters may be included over the light sources and/or the light detectors to improve discrimination between a user's finger and water droplets. An interface between air and the display cover layer is characterized by a first critical angle. An interface between water and the display cover layer is characterized by a second critical angle. The interference filters over the light sources may have a greater transmission for light at the wavelength of interest (such as near-infrared light) at a first incident angle that is less than the first critical angle than at a second incident angle that is greater than the first critical angle. The interference filters over the light detectors may have a greater transmission for light at the wavelength of interest (such as near-infrared light) at a first incident angle that is greater than the second critical angle than at a second incident angle that is less than the second critical angle.

Direct illumination optical touch sensors and total internal reflection touch sensors both rely on light passing through the detection surface of a cover material located above the integrated touch screen to photodiodes located below the cover material. However, light impinging on the boundary between the detection surface and a medium above the detection surface (e.g., air, water, finger, or stylus), from either above or below the detection surface, can reflect off the boundary or be refracted as it passes through the boundary. In some instances, this reflected or refracted light can be detected and incorrectly identified as a touching object. Accordingly, in some embodiments of the disclosure, light illuminator angular filters can be employed within each LED component configured as an illuminator to limit the illumination angle of those illuminators, and light detector angular filters can be employed within each photodiode component configured as a detector to limit the detection angle of those detectors. Each angular filter acts as mask, including an inner mask baffle and an outer mask, that together effectively block or filter light transmitted, reflected or refracted within the cover material to facilitate a customized angular response that reduces or eliminates the false detection of water droplets on the touch surface.

Forming the inner mask baffle and the outer mask at the photodiode component level, during the fabrication of the photodiode component, can provide several advantages. By doing so, the process of forming the inner mask baffle and the outer mask can be isolated from the display assembly process, and the baffle and mask become part of the modularized photodiode component, thereby casing the challenges of forming the baffle and mask at a higher level of integration. Forming the inner mask baffle and outer mask within the photodiode component also miniaturizes the baffle and mask to produce a smaller footprint, and in some instances component-level fabrication processes can enable formation of the baffle and mask with greater accuracy than at the display assembly level. In contrast, forming the inner mask baffle and outer mask at a higher level of integration, such as at the display assembly level, requires that the baffle and mask be formed at a greater height above the photosensitive surface of the photodiode as compared to the photodiode component level, which in turn requires that the baffle and mask be larger and consume more display surface area.

A schematic diagram of an illustrative electronic device that may include an optical touch sensor is shown in FIG. 1. Electronic device 10 of FIG. 1 may be a computing device such as a laptop computer, a computer monitor containing an embedded computer, a tablet computer, a cellular telephone, a media player, or other handheld or portable electronic device, a smaller device such as a wristwatch or other device worn on a user's wrist, a pendant device, a headphone or earpiece device, a head-mounted device such as eyeglasses, goggles, or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. Illustrative configurations in which device 10 is a portable device such as a wristwatch, cellular telephone, or tablet computer and, more particularly, a portable device that is water resistant or waterproof may sometimes be described herein as an example.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-accessmemory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc. Control circuitry 16 may include communications circuitry for supporting wired and/or wireless communications between device 10 and external equipment. For example, control circuitry 16 may include wireless communications circuitry such as cellular telephone communications circuitry and wireless local area network communications circuitry.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, haptic output devices, cameras, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be an organic light-emitting diode display, a display formed from an array of crystalline semiconductor light-emitting diode dies, a display formed from an array or regular LEDs, a display formed from an array of micro-LEDs, a liquid crystal display, or other display. Display 14 may be a touch screen display that includes an optical touch sensor for gathering touch input from a user. The optical touch sensor may be configured to operate even when device 10 is immersed in water or otherwise exposed to moisture. If desired, the optical touch sensor may also be configured to operate when a user is wearing gloves, which might be difficult or impossible with some capacitive touch sensors. Moreover, because the optical touch sensor operates optically, the touch sensor is not impacted by grounding effects that might impact the operation of capacitive touch sensors.

As shown in FIG. 1, input-output devices 12 may include sensors 18. Sensors 18 may include touch sensors. Touch sensors may be provided for display 14 and/or other portions of device 10 and may be formed from an array of capacitive touch sensor electrodes, acoustic touch sensor structures, resistive touch components, force-based touch sensor structures, light-based touch sensor structures, or other suitable touch sensor arrangements. Illustrative optical touch sensor arrangements for device 10 (e.g., for display 14 of device 10) are sometimes described herein as an example.

Sensors 18 may include capacitive sensors, light-based proximity sensors, magnetic sensors, accelerometers, force sensors, touch sensors, temperature sensors, pressure sensors, inertial measurement units, accelerometers, gyroscopes, compasses, microphones, radio-frequency sensors, three-dimensional image sensors (e.g., structured light sensors with light emitters such as infrared light emitters configured to emit structured light and corresponding infrared image sensors, three-dimensional sensors based on pairs of two-dimensional image sensors, etc.), cameras (e.g., visible light cameras and/or infrared light cameras), light-based position sensors (e.g., lidar sensors), monochrome and/or color ambient light sensors, and other sensors. Sensors 18 such as ambient light sensors, image sensors, optical proximity sensors, lidar sensors, optical touch sensors, and other sensors that use light and/or components that emit light such as status indicator lights and other light-emitting components may sometimes be referred to as optical components.

It is to be understood that electronic device 10 is not limited to the components and configuration described with respect to FIG. 1, but can include other or additional components in multiple configurations according to various examples. Additionally, the components of electronic device 10 can be included within a single device, or can be distributed between multiple devices.

Figure 2:
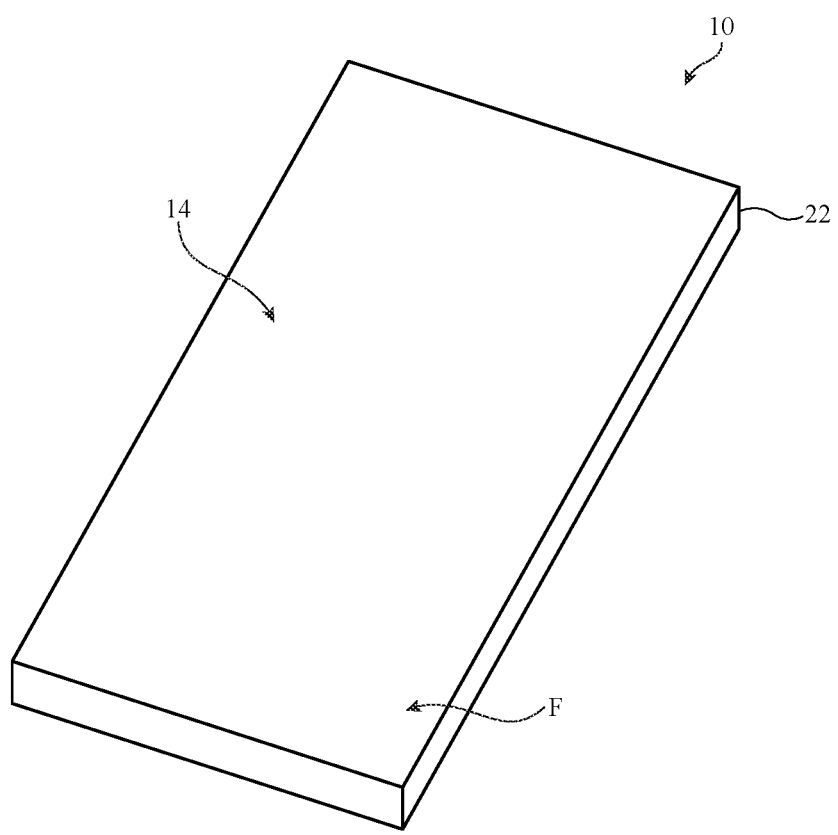
FIG. 2 is a perspective view of an illustrative electronic device in accordance with some embodiments of the disclosure.

A perspective view of an illustrative electronic device of the type that may include an optical touch sensor is shown in FIG. 2. In the example of FIG. 2, device 10 includes a display such as display 14 mounted in housing 22. Display 14 may be a liquid crystal display, a light-emitting diode display such as an organic light-emitting diode display or a display formed from crystalline semiconductor light-emitting diode dies, or other suitable display. Display 14 may have an array of image pixels extending across some or all of front face F of device 10 and/or other external device surfaces. The array of image pixels may be rectangular or may have other suitable shapes. Display 14 may be protected using a display cover layer (e.g., a transparent front housing layer) such as a layer of transparent glass, clear plastic, sapphire, or other clear layer. The display cover layer may overlap the array of image pixels.

Figure 3:
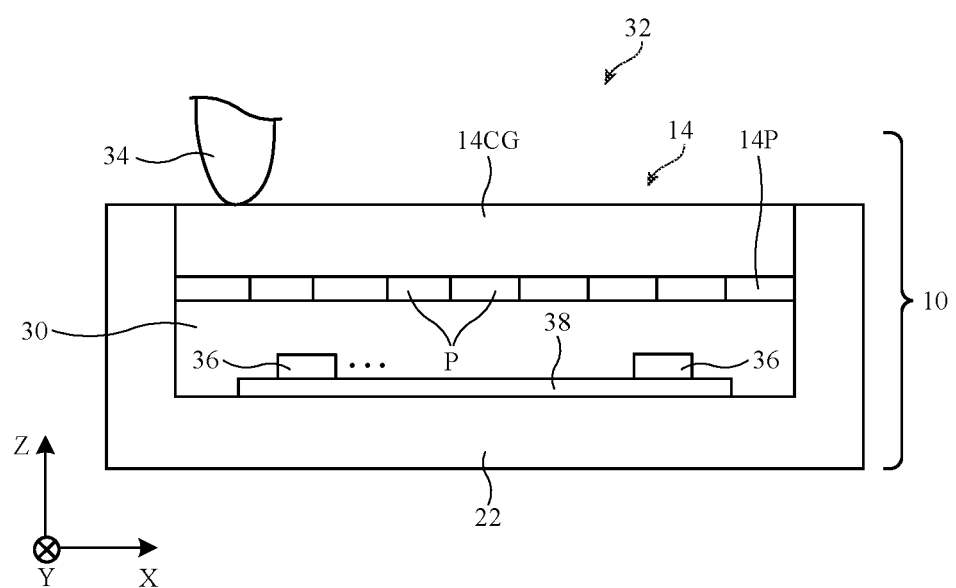
FIG. 3 is a side view of an illustrative electronic device in accordance with some embodiments of the disclosure.

Housing 22, which may sometimes be referred to as an enclosure or case, may be formed of plastic, glass, ceramics, fiber composites, metal (e.g., stainless steel, aluminum, etc.), other suitable materials, or a combination of any two or more of these materials. As shown in the side view of device 10 of FIG. 3, housing 22 and display 14 may separate an interior region of device 10 such as interior region 30 from an exterior region surrounding device 10 such as exterior region 32. Housing 22 may be formed using a unibody configuration in which some or all of housing 22 is machined or molded as a single structure or may be formed using multiple structures (e.g., an internal frame structure, one or more structures that form exterior housing surfaces, etc.). If desired, a strap may be coupled to a main portion of housing 22 (e.g., in configurations in which device 10 is a wearable device, such as a wristwatch or head-mounted device). Internal electrical components 36 (e.g., integrated circuits, discrete components, etc.) for forming control circuitry 16 and input-output devices 12 may be mounted in interior 30 of housing 22 (e.g., on one or more substrates such as printed circuit 38). In some configurations, components 36 may be attached to display 14 (e.g., circuitry may be mounted to the surface of display 14). To obtain touch input from a user's fingers or other external object (see, e.g., user finger 34 or a stylus), display 14 may include a touch sensor such as an optical touch sensor (e.g., a two-dimensional optical touch sensor that gathers information on the XY location of a user's finger or other external object when that object touches the surface of display 14).

Display 14 may include a display panel such as display panel 14P that contains pixels P covered by display cover layer 14CG. The pixels of display 14 may cover all of the front face of device 10 or display 14 may have pixel-free areas (e.g., notches, rectangular islands, inactive border regions, or other regions) that do not contain any pixels. Pixel-free areas may be used to accommodate an opening for a speaker and windows for optical components such as image sensors, an ambient light sensor, an optical proximity sensor, a three-dimensional image sensor such as a structured light three-dimensional image sensor, a camera flash, an illuminator for an infrared image sensor, an illuminator for a three-dimensional sensor such as a structured light sensor, a time-of-flight sensor, a lidar sensor, etc.

Figure 4:
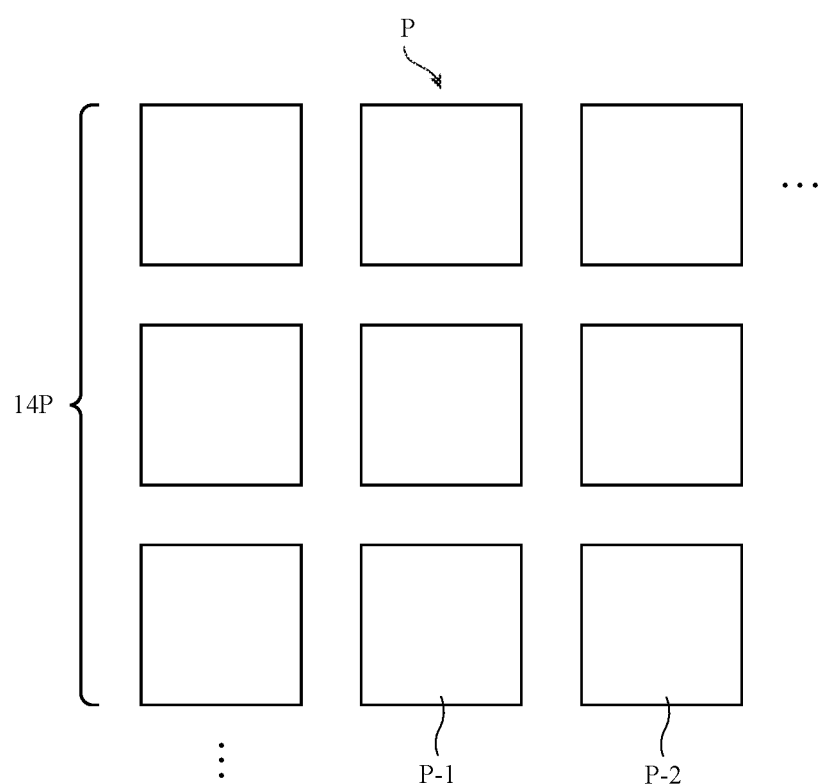
FIG. 4 is a top view of an illustrative array of pixels for an electronic device in accordance with some embodiments of the disclosure.

FIG. 4 is a top view of an array of illustrative pixels P in display panel (display) 14P. As shown in FIG. 4, pixels P may include image pixels such as pixel P-1 that are used in presenting images for a user of device 10. Image pixels in display 14 may, for example, include a rectangular array of red, green, and blue light-emitting diodes or backlit red, green, and blue liquid crystal display pixels for presenting color images to a user.

Pixels P may also contain optical touch sensor pixels such as pixel P-2. Optical touch sensor pixels may include pixels that serve as light detectors and/or light emitters. Emitted light that reflects from an object such as a user's finger on the surface of display 14 may be detected using the light detectors, thereby determining the location of the object. If desired, diodes or other components may be used to form pixels that can be operated both as image pixels and as touch sensor pixels. When used as touch sensor pixels, image pixels can be configured to emit optical touch sensor illumination and/or to detect optical touch sensor light. For example, a display emitter can be used to produce image light for a display while also being used to produce optical touch sensor illumination, and/or while also being used to serve as a photodetector (sometimes referred to as a light detector) for an optical touch sensor.

Image pixels such as pixels P-1 and/or optical touch sensor pixels P-2 may have any suitable pitch. For example, image pixels may have a density that is sufficient to display high-quality images for a user (e.g., 200-300 pixels per inch or more, as an example), whereas optical touch sensor pixels may, if desired, have a lower density (e.g., less than 200 pixels per inch, less than 50 pixels per inch, less than 20 pixels per inch, etc.). Optical touch sensor pixels P-2 may include both light sources and light detectors. The light sources may have a density of less than 200 pixels per inch, less than 50 pixels per inch, less than 20 pixels per inch, etc. The light detectors may have a density of less than 200 pixels per inch, less than 50 pixels per inch, less than 20 pixels per inch, etc.

Image pixels emit visible light for viewing by a user. For example, in a color display, image pixels may emit light of different colors of image light such as red, green, and blue light, thereby allowing display 14 to present color images. Optical touch sensor pixels may emit and/or detect visible light and/or infrared light such as near infrared light (and/or, if desired, ultraviolet light).

In some configurations, optical touch sensor light for illuminating an object such as a user's fingers or a stylus passes directly through the thickness of display cover layer 14CG from its interior surface to its exterior surface. Optical touch sensors in which light that illuminates objects such as a user's fingers or a stylus passes outwardly from light sources such as light-emitting pixels in display panel 14P directly through the thickness of display cover layer 14CG before being backscattered in the reverse (inward) direction to the light detectors of the optical touch sensors may sometimes be referred to herein as direct illumination optical touch sensors.

In other configurations, light for an optical touch sensor may be guided within layer 14CG in accordance with the principal of total internal reflection. For example, a light-emitting diode may emit light into the righthand edge of display cover layer 14CG that is guided from the righthand edge of display cover layer 14CG to the opposing lefthand edge of display cover layer 14CG within the light guide formed by display cover layer 14CG. In this way, light may be guided laterally across layer 14CG in the absence of contact from an object such as a user's finger or a stylus. When an object such as a user's finger or a stylus touches the surface of layer 14CG, total internal reflection can be locally defeated. This local frustration of total internal reflection scatters light inwardly toward the light detectors of the optical touch sensor. Optical touch sensors that are based on locally defeating total internal reflection may sometimes be referred to herein as total internal reflection optical touch sensors. If desired, objects other than the fingers of users (e.g., a computer stylus, a glove, and/or other external objects with appropriate optical properties) may also locally defeat total internal reflection, thereby allowing the optical touch sensors to function over a wide range of operating environments.

Pixels P that emit light and pixels P that detect light in display panel 14P may be formed using shared structures and/or structures that are separate from each other. These structures may be located in the same plane (e.g., as part of a single layer of pixels on a single substrate) and/or may include components located in multiple planes (e.g., in arrangements in which some components are formed in a given layer and other components are formed in one or more additional layers above and/or below the given layer).

Consider, as an example, an optical touch sensor that contains an array of photodetectors formed from reverse-biased diodes. These diodes may be dedicated photodetectors or may be light-emitting diodes that serve as light detectors when reverse biased and that serve as light sources when forward biased. Light sources in the optical touch sensor may include visible light sources (e.g., visible light sources dedicated to use in the optical touch sensor or visible light sources that also serve as image pixels) and/or may include infrared light sources. Light-emitting pixels for the optical touch sensor may be formed from light-emitting diodes (e.g., dedicated light-emitting diodes or diodes that serve as light-emitting diodes when forward biased and that serve as photodetectors when reversed biased). Light-emitting pixels may also be formed from pixels P that are backlit with light from a backlight unit to form backlit pixels (e.g., backlit liquid crystal display pixels). In general, any type of photodetector signal processing circuitry may be used to detect when a photodetector has received light. For example, photodetectors may be configured to operate in a photoresistor mode in which the photodetectors change resistance upon exposure to light and corresponding photodetector signal processing circuitry may be used to measure the changes in photodetector resistance. As another example, the photodetectors may be configured to operate in a photovoltaic mode in which a voltage is produced when light is sensed and corresponding photodetector signal processing circuitry may be used to detect the voltage signals that are output from the photodetectors. Semiconductor photodetectors may be implemented using phototransistors or photodiodes. Other types of photosensitive components may be used, if desired.

Figure 5:
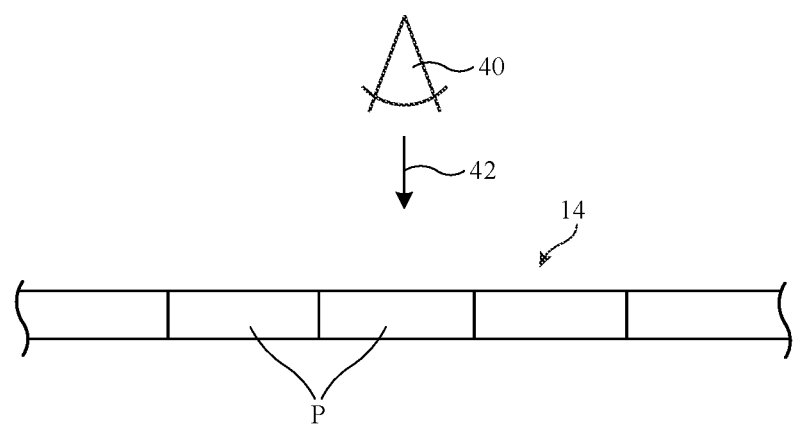
FIGS. 5 and 6 are side views of illustrative pixel arrays for electronic devices in accordance with some embodiments of the disclosure.

FIG. 5 is a side view of an illustrative display having an array of pixels P that are not backlit. Pixels P of FIG. 5 may include light-emitting diodes (e.g., organic light-emitting diodes such as thin-film organic light-emitting diodes and/or light-emitting diodes formed from crystalline semiconductor light-emitting diode dies). During operation, image pixels formed from the light-emitting diodes may present an image on display 14 that is visible to a user such as viewer 40 who is viewing display 14 in direction 42.

Figure 6:
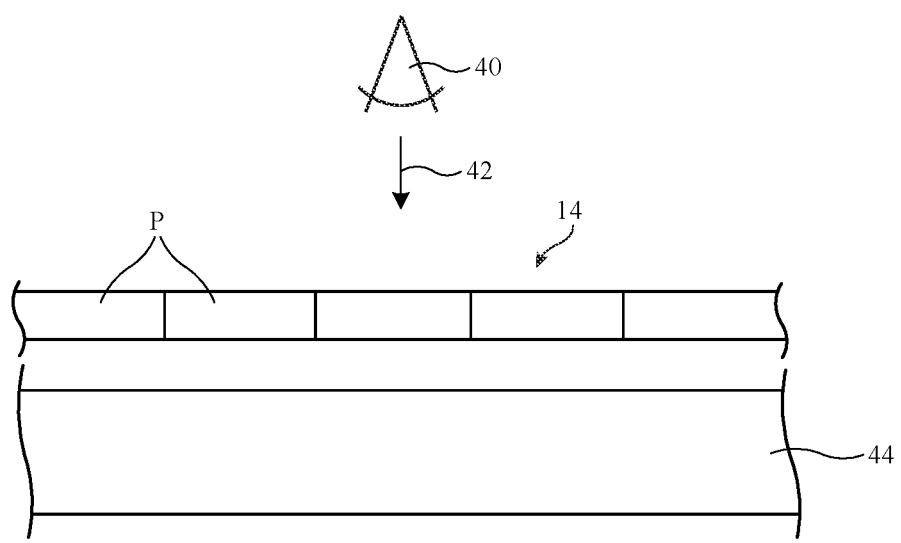

FIG. 6 is a side view of an illustrative display having an array of pixels P that are backlit using backlight unit 44.

Backlight unit 44 may include one or more strips of light-emitting diodes that emit light into a backlight unit light guide layer (e.g., a clear optical film with light-scattering structures). As the emitted light propagates through the light guide layer, the scattered light serves as backlight illumination for pixels P (e.g., liquid crystal display pixels). In another illustrative configuration, backlight unit 44 is a direct lit backlight unit that contains an array of backlight light-emitting diodes that provide backlight (e.g., an array-type backlight unit that supports local dimming functionality).

Figure 7:
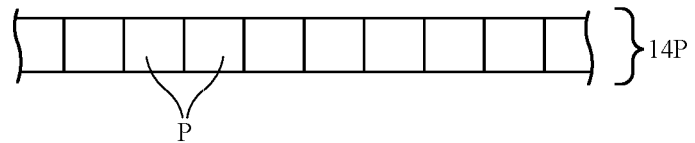
FIGS. 7, 8, and 9 are side views of illustrative display and sensor arrangements with different numbers of pixel layers in accordance with some embodiments of the disclosure.
Figure 8:
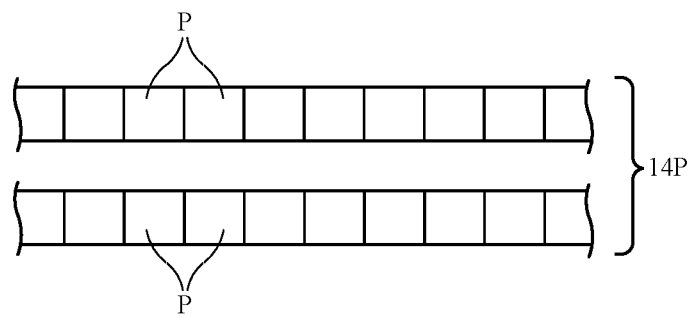
Figure 9:
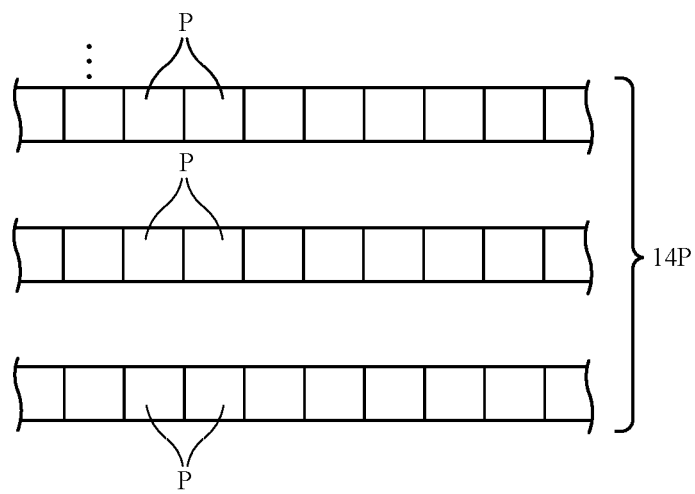

In display 14 (e.g., in display panel 14P), the image pixels that are used in displaying images for a user (e.g., the red, blue, and green pixels in a color display) and/or the optical touch sensor pixels (e.g., light emitters and/or detectors for implementing a direct illumination and/or total internal reflection optical touch sensor) may be implemented using one or more layers of pixels, as shown in the side view of the illustrative displays of FIGS. 7, 8, and 9. FIG. 7 is an illustrative arrangement for display panel 14P that has a single layer of pixels P. In FIG. 8, two layers of pixels P are used in display panel 14P. The diagram of FIG. 9 shows how display panel 14P may, if desired, have three or more layers of pixels P. In general, optical touch sensor pixels may be located in the same layer as image pixels (i.e., coplanar with the image pixels) and/or may be located in a layer that is above or below the image pixels.

Pixels P of FIGS. 7, 8, and 9 may include image pixels and/or optical touch sensor pixels. In some arrangements, pixels P may include backlight pixels that supply backlight illumination in a local dimming backlight unit. The pixels P in different layers may have the same pitch or different pitches. As an example, there may be more image pixels per inch than optical touch sensor pixels. Thin-film structures and/or discrete devices may be used in forming pixels P.

Figure 10:
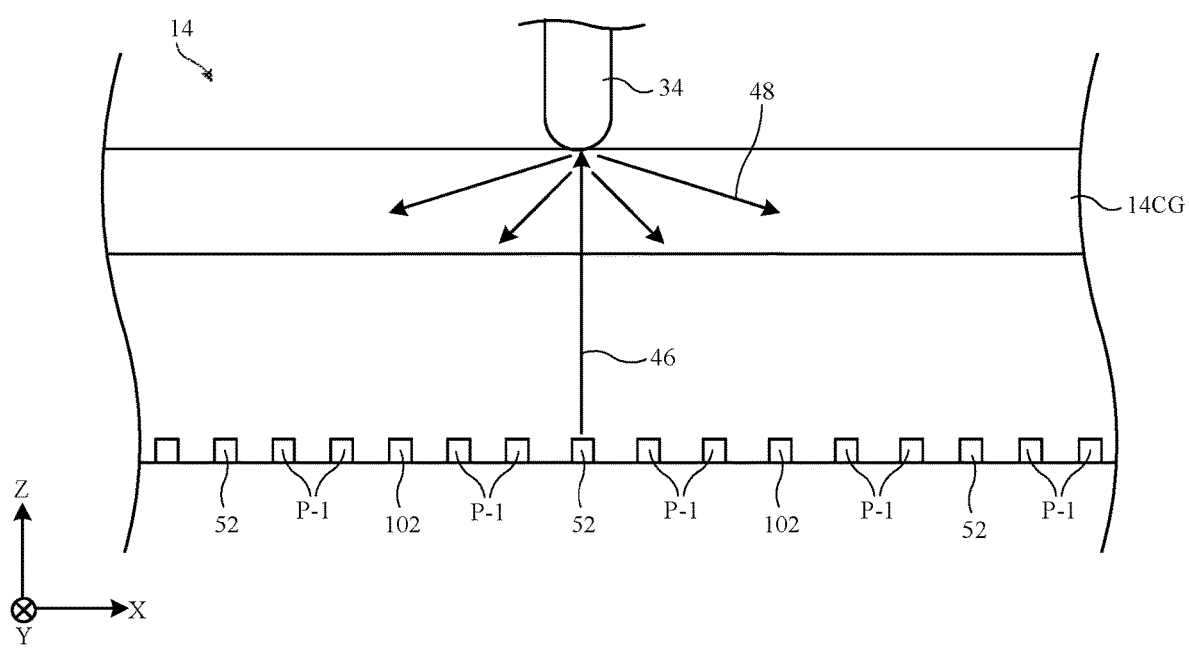
FIG. 10 is a side view of an illustrative optical touch sensor when a display cover layer is contacted by a finger in accordance with some embodiments of the disclosure.

FIG. 10 is a side view of an illustrative display with a direct illumination optical touch sensor. In the example of FIG. 10, light sources 52 and detectors 102 for the optical touch sensor are coplanar with image pixels P-1. As shown in FIG. 10, light source 52 may emit illumination 46 that travels directly through display cover layer 14CG from its inner surface to its outer surface, thereby illuminating an external object contacting the surface of display 14 such as finger 34. This creates localized backscattered light 48 that propagates in the inward (−Z) direction and that is detected by photodetectors (such as detectors 102) associated with display panel 14P that are below finger 34. In this way, the optical touch sensor can determine the lateral position (XY location) of finger 34.

Note that the backscattered light 48 that reflects off finger 34 is distributed across a wide range of angles (e.g., approximately −90 degrees to 90 degrees relative to the Z-axis).

Figure 11:
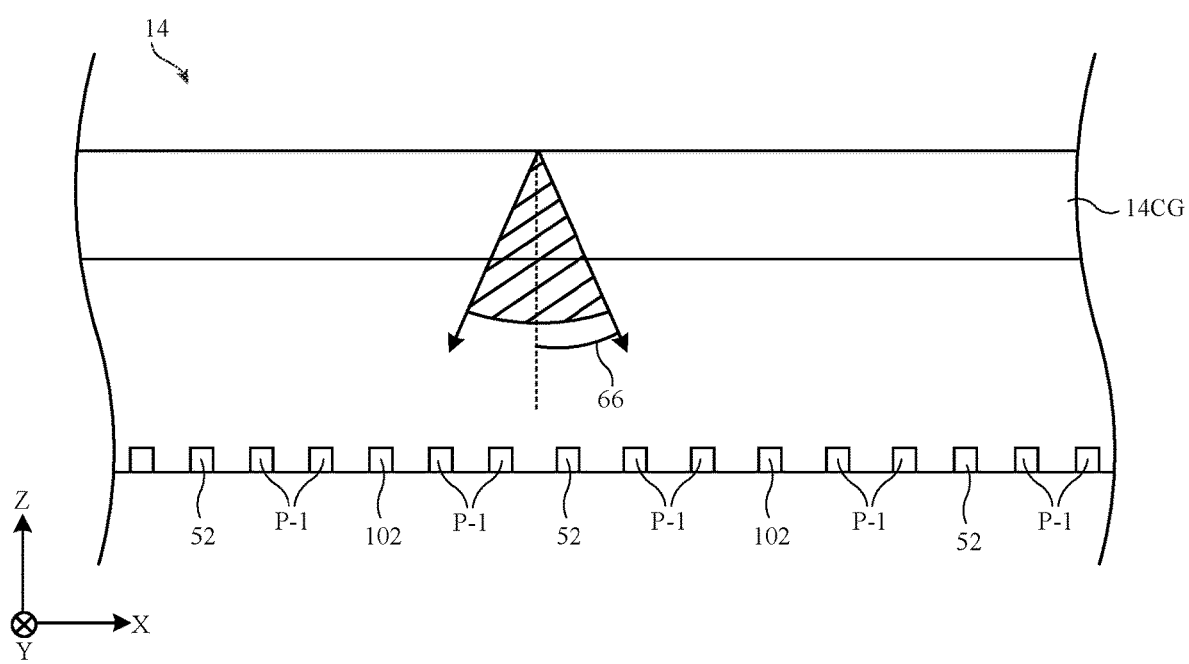
FIG. 11 is a side view of an illustrative optical touch sensor when ambient light passes through a display cover layer in accordance with some embodiments of the disclosure.

To improve the performance of the direct illumination optical touch sensor, care may be taken to discriminate between backscattered light from finger 34 and noise light from other sources. One source of noise, shown in FIG. 11, is ambient light. As shown in FIG. 11, ambient light such as ambient light 62 may pass through display cover layer 14CG. If care is not taken, the ambient light may be detected by one or more detectors 102, undesirable decreasing the signal-to-noise ratio within the optical touch sensor.

Snell's law dictates that, at an interface between two materials, there is a critical angle above which substantially all of the incident light will be reflected (via total internal reflection). Consider the angle 66 relative to the Z-axis in FIG. 11. When incident light travels through the air in the negative Z-direction and strikes the display cover layer 14CG, incident light will pass through the interface into the display cover layer. The refracted rays can only transmit at angles less than or equal to the critical angle 66 inside the 14CG layer. Likewise, rays originating from inside the 14CG layer can only transmit into air if their angle relative the z-axis is less than or equal to the critical angle. If the rays inside the 14CG material exceed the critical angle, then they will be totally internally reflected. The cross-hatched region in FIG. 11 shows the range of angles within which incident light passes through the display cover layer.

To summarize, incident light that passes through display cover layer 14CG from the exterior of the electronic device must, by definition, pass through the display cover layer with an angle A that is less than the critical angle. Consider an example where display cover layer 14CG is formed from glass with a refractive index of 1.5. In this case, the critical angle of the interface between air and the glass is 42 degrees. Therefore, ambient light that passes from the exterior of electronic device 10 through display cover layer 14CG has an angle that is greater than −42 degrees and less than 42 degrees inside of the glass, and ranges from −90 to 90 degrees in air.

It is desirable for the optical touch sensor herein to discriminate between an object such as a user's finger or a stylus, and a water droplet. This ensures that water droplets are not improperly interpreted as touch events.

Figure 12:
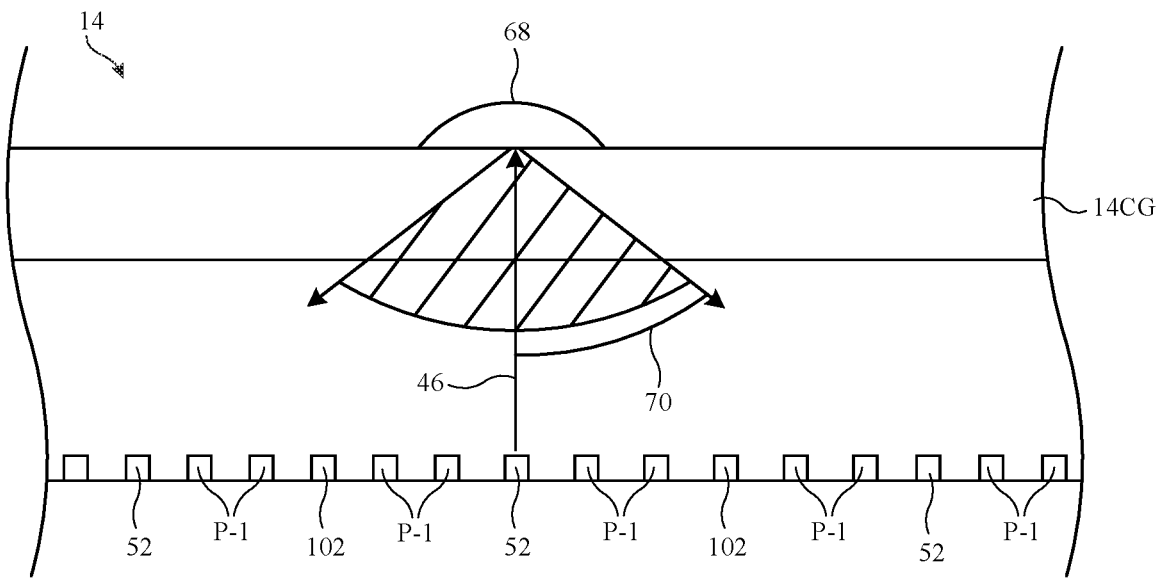
FIG. 12 is a side view of an illustrative optical touch sensor when a display cover layer is contacted by a water droplet in accordance with some embodiments of the disclosure.

FIG. 12 shows a side view of a display with a water droplet 68 on the outer surface of display cover layer 14CG. Illumination 46 from light source 52 may reflect off of water droplet 68 and be detected by one or more detectors 102, thus reducing the signal-to-noise ratio. Light that reflects off of water droplet 68 may enter display cover layer 14CG (from water 68) within the critical angle 70 dictated by the interface of the water and the display cover layer. Water has a refractive index of 1.33. Therefore, as one specific example, the critical angle (where the water has a refractive index of 1.33 and the display cover layer has a refractive index of 1.5) may be 62.7 degrees. Reflected light from within the water droplets therefore cannot have an angle inside the display cover layer that is greater than −62.7 degrees and less than 62.7 degrees. The cross-hatched region in FIG. 12 shows the range of angles within which the reflected light (off of water) passes through the display cover layer.

The signal-to-noise ratio of the optical touch sensor may therefore be improved by blocking light that is incident on photodetectors with angles greater than −62.7 degrees and less than 62.7 degrees. Blocking light within these angles will necessarily (as described in connection with FIG. 12) block noise caused by reflections returning from inside of water on the surface of the display cover layer. The angular distribution of ambient light (as described in connection with FIG. 11) is a subset of the angular distribution of light reflected from water (as described in connection with FIG. 12). Therefore, blocking light within these angles will also necessarily block noise caused by ambient light. The remaining signal that is detected by the photodetector (caused by incident light at angles that are less than −62.7 degrees and greater than 62.7 degrees) is a result of the backscattered reflections off of finger 34 (as shown in FIG. 10). An angular filter may be applied to the detectors 102 to block light within the aforementioned angular range and improve the signal-to-noise ratio of the optical touch sensor.

Figure 13:
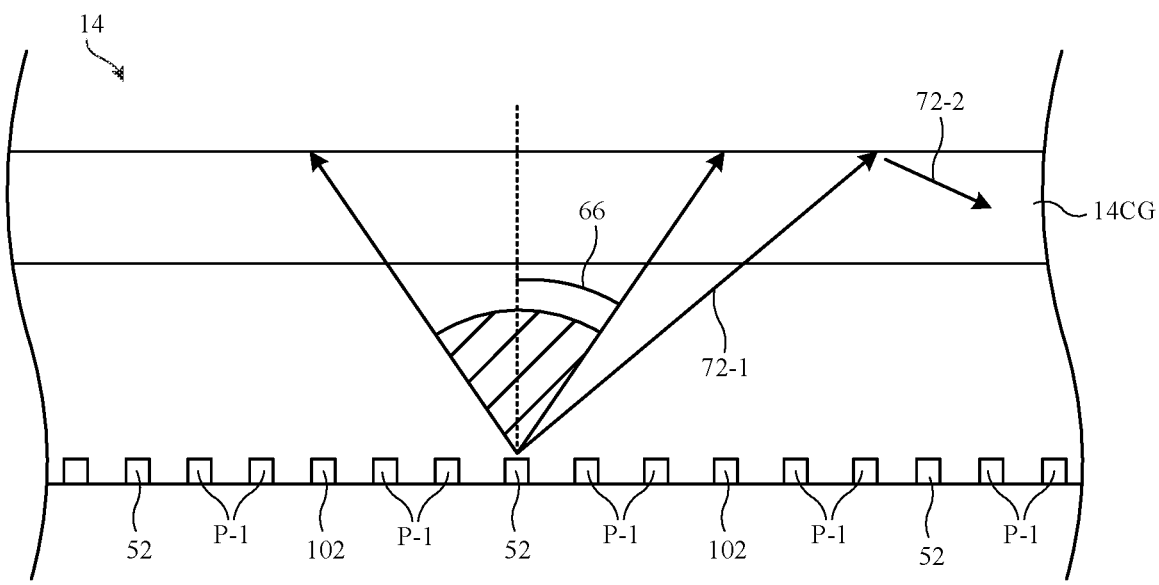
FIG. 13 is a side view of an illustrative optical touch sensor with a light source in accordance with some embodiments of the disclosure.

Additional signal-to-noise ratio improvements in the optical touch sensor may be achieved by also applying an angular filter to the light sources. As shown in FIG. 13, light emitted by light source 52 that is greater than the negative magnitude of the critical angle 66 and less than the positive magnitude of the critical angle 66 will pass through display cover layer 14CG. The cross-hatched region in FIG. 13 shows the range of angles within which the transmitted light passes through the display cover layer. However, light that is less than the negative magnitude of the critical angle 66 and greater than the positive magnitude of the critical angle 66 will be reflected. For example, see incident light 72-1 with an angle that is greater than the critical angle and is therefore reflected as reflection 72-2.

An angular filter may therefore be applied to light source 52 that causes light source 52 to only emit light at angles that are greater than the negative magnitude of the critical angle and less than the positive magnitude of the critical angle. This ensures that light that is not backscattered (e.g., by a user's finger) will pass through the display cover layer 14CG (instead of reflecting off of the upper surface of the display cover layer 14CG as with reflection 72-2 and possibly being detected by one or more detectors 102).

Figure 14:
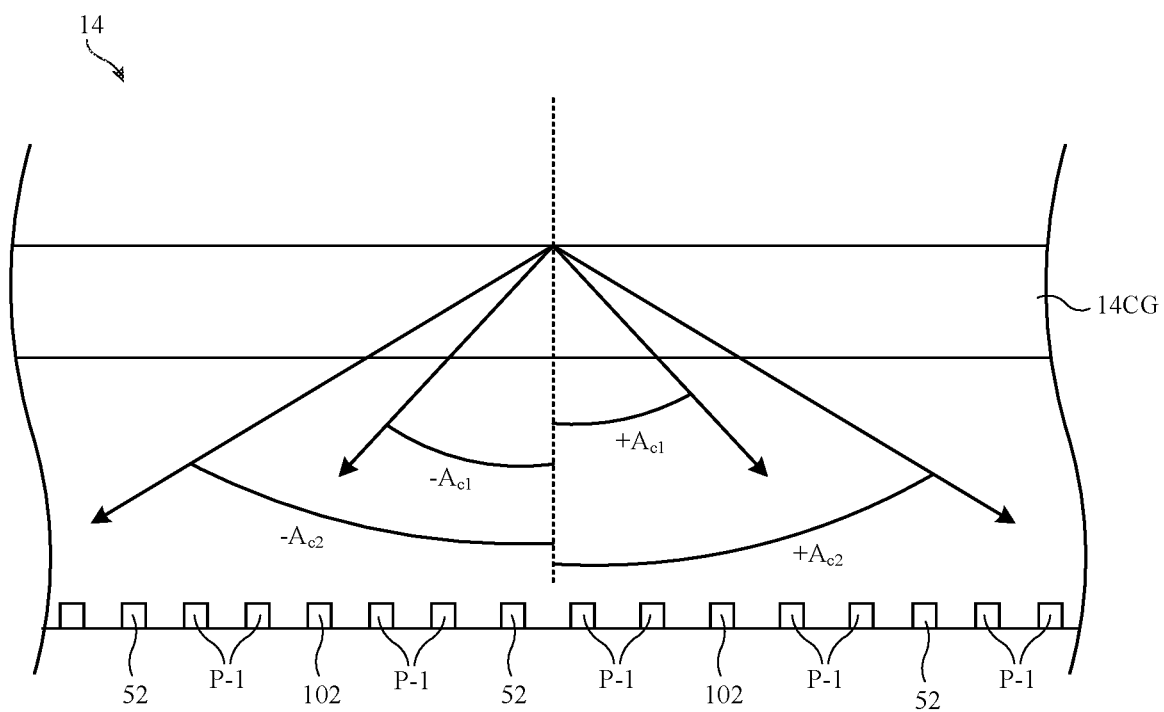
FIG. 14 is a side view of an illustrative optical touch sensor showing critical angles associated with the optical touch sensor in accordance with some embodiments of the disclosure.

To summarize, as shown in FIG. 14, there is a first critical angle $A_{C1}$ associated with the interface of display cover layer 14CG and air (as dictated by the refractive index of the display cover layer 14CG and the refractive index of air). Light travelling from the display cover layer to the air is transmitted when the incident angle A is within the angular range that is not subject to total internal reflection (e.g., $|A|<|A_{C1}|$). Incident light travelling from the display cover layer to the air is internally reflected when the incident angle A is larger than the critical angle (e.g., $|A|>|A_{C1}|$). Light incident from the air may only propagate inside the display cover layer within the angular range bounded by the critical angle (e.g., $|A|<|A_{C1}|$). In some examples, the critical angle $A_{C1}$ can be determined to be +/−42 degrees from the surface normal. For practical applications, the critical angle $A_{C1}$ can include some margin, such as +/−42 degrees+/−1 degree from the surface normal, or +/−42 degrees+/−2%.

There is a second critical angle $A_{C2}$ associated with the interface of display cover layer 14CG and water (as dictated by the refractive index of the display cover layer 14CG and the refractive index of water). Light travelling from the display cover layer to water is transmitted when the incident angle A is smaller than the critical angle (e.g., $|A|<|A_{C2}|$). Incident light travelling from the display cover layer to water is internally reflected when the incident angle A is larger than the critical angle (e.g., $|A|>|A_{C2}|$). Light incident from the water only propagates inside the display cover layer within the angular range bounded by the critical angle (e.g., $|A|<|A_{C2}|$). In some examples, the critical angle $A_{C2}$ can be determined to be +/−62.7 degrees from the surface normal. For practical applications, the critical angle $A_{C2}$ can include some margin, such as +/−62.7 degrees+/−1 degree from the surface normal, or +/−62.7 degrees+/−2%.

The refractive index of water is greater than the refractive index of air, which causes $A_{C2}$ to be greater than $A_{C1}$.

To mitigate signal contamination from ambient light in the optical touch sensor for device 10, an angular filter may be applied to detectors for the optical touch sensor. The angular filter may transmit light at incident angles that are outside of the critical angle $A_{C2}$ associated with the interface of water and the display cover layer. In other words, the angular filter transmits light at incident angle A when $|A|>|A_{C2}|$ and blocks light at incident angle A when $|A|<|A_{C2}|$. This type of angular filter blocks substantially all ambient light and substantially all light that is refracted through the glass-water interface.

To mitigate cross talk from the internal illumination sources in the optical touch sensor for device 10, an angular filter may also be applied to light sources for the optical touch sensor. The angular filter may be tailored to an angular range that would prevent a direct path from the emitters to the position sensing elements in the photodiode array, which would include a path dependent upon a total internal reflection at the cover glass, originating from the source emitter.

Figure 15:
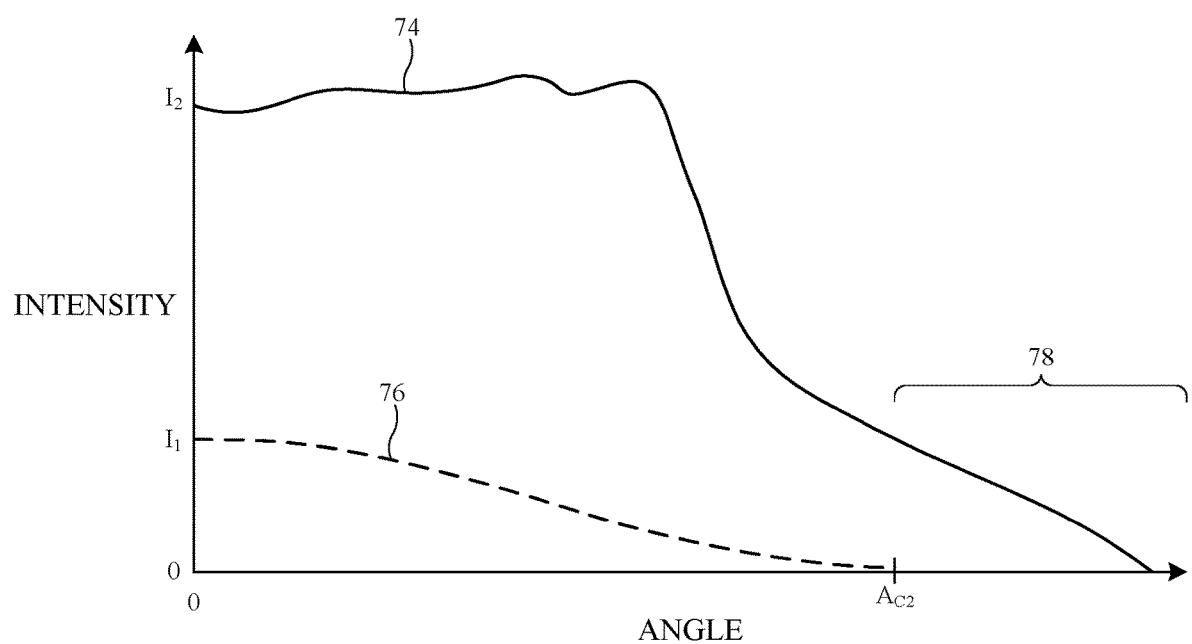
FIG. 15 is a graph of intensity as a function of incident angle for light reflected from a finger and light reflected from a water droplet in accordance with some embodiments of the disclosure.

FIG. 15 is a graph of intensity as a function of incident angle on a detector 102 in the optical touch sensor. Profile 74 shows the intensity of backscattered light from a user's finger. In other words, profile 74 is the desired signal for optical touch sensing. Profile 76 shows the intensity of reflected light from water. In other words, profile 76 is a noise signal for the optical touch sensing.

As shown in FIG. 15, profile 76 has a peak intensity $I_1$ at an incident angle of 0 degrees (e.g., parallel to the Z-axis). The magnitude of the intensity of profile 76 drops with increasing angle and reaches 0 at the critical angle $A_{C2}$ (because reflections off the water are necessarily at an angle below the critical angle $A_{C2}$). Profile 74 has a peak intensity $I_2$ at an incident angle of 0 degrees (e.g., parallel to the Z-axis). The magnitude of the intensity of profile 76 drops with increasing angle. However, the magnitude of the intensity of profile 76 is greater than 0 beyond critical angle $A_{C2}$. Therefore, a detector that blocks incident light at angles less than $A_{C2}$ (and transmits light in range 78 above $A_{C2}$) will detect light from a user's finger but not from a water droplet.

Figure 16:
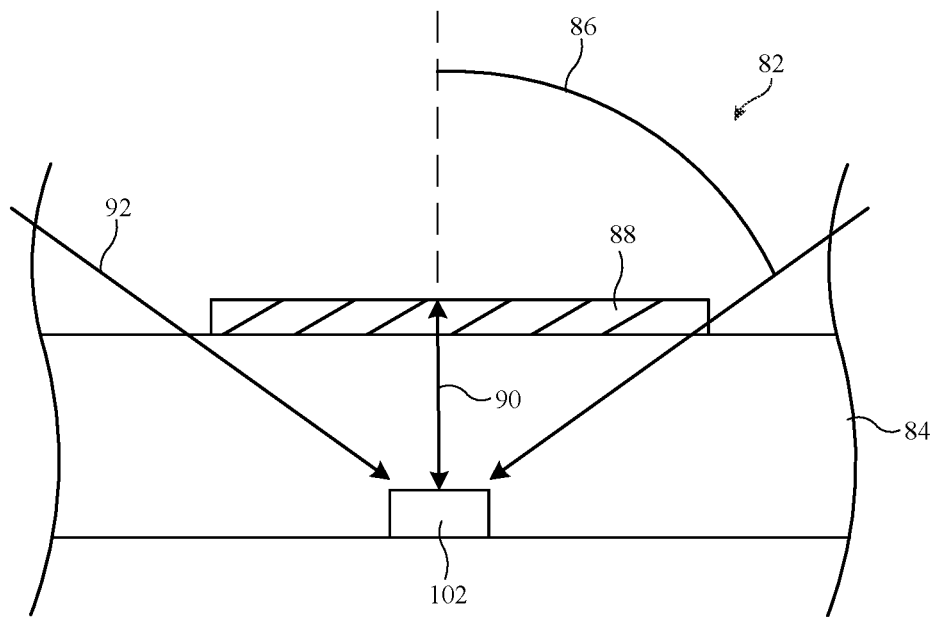
FIG. 16 is a side view of an illustrative light detector that is covered by an angular filter with a light blocking mask layer in accordance with some embodiments of the disclosure.

In one possible arrangement, a light blocking angular filter 82 is formed over photodetector 102 (sometimes referred to as light detector 102) using one or more masking layers. As shown in FIG. 16, angular filter 82 may be formed from one or more mask layers 88 on a transparent layer 84. Mask 88 may be formed from black ink, metal, or other opaque masking materials that are substantially opaque (e.g., with opacity greater than 80%, greater than 90%, greater than 95%, greater than 98%, etc.). Transparent layer 84 may be one of the layers in panel 14P such as an encapsulation layer or other clear dielectric layer.

As shown in FIG. 16, mask layer 88 physically blocks incident light at on-axis angles. On-axis angles may refer to angles that are parallel or close to parallel (e.g., within 10 degrees of parallel) to the surface normal (e.g., Z-axis). In contrast, off-axis angles may refer to angles that are not close to parallel (e.g., greater than 10 degrees from parallel) to the surface normal. Light that reaches detector 102 has an angle that is greater than angle 86. The dimensions of the mask layer and the separation 90 between the mask layer and the detector may be selected to block incident light at a desired angle. The angular filter in FIG. 16 may, for example, transmit light 92 at incident angle A when $A<-A_{C2}$ or $A>+A_{C2}$ and block light at incident angle A when $-A_{C2}<A<+A_{C2}$.

The angular filter of FIG. 16 may require a total thickness (e.g., the separation 90 from the top of the detector to the top of the masking layer) that is greater than desired. The thickness of the angular filter may undesirably increase the thickness of the display. Additionally, due to separation 90 the masking layer may block adjacent pixels P-1 that are used in presenting images for a user of device 10.

To mitigate the thickness of the display and blocking the operation of pixels P-1, an interference filter may be used as the angular filter instead of the light blocking filter of FIG. 16. An interference filter (sometimes referred to as a dichroic filter or thin-film interference filter) includes multiple sublayers with alternating index of refraction values. An interference filter selectively transmits incident light based on the interference effects at the interfaces between the layers within the interference filter.

Figure 17:
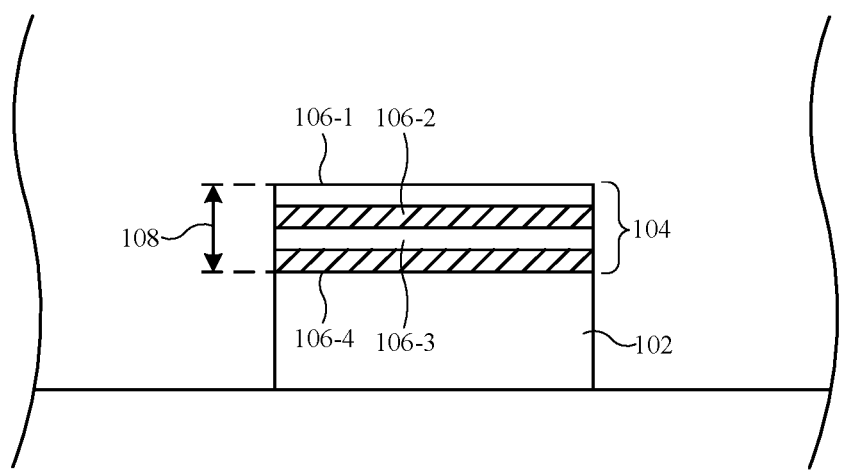
FIG. 17 is a side view of an illustrative light detector that is covered by an interference filter in accordance with some embodiments of the disclosure.

FIG. 17 is a cross-sectional side view of an illustrative detector 102 that includes an interference filter 104. As shown, the interference filter is formed directly on an upper surface of the detector. In other words, the interference filter is in direct contact with the upper surface of the detector. The interference filter may include a plurality of sublayers 106. In FIG. 17, the interference filter includes four sublayers: sublayer 106-1, sublayer 106-2, sublayer 106-3, and sublayer 106-4. The sublayers may alternate between different materials. For example, sublayers 106-1 and 106-3 may be formed from a first material whereas sublayers 106-2 and 106-4 may be formed from a second material.

The first and second materials may have an index of refraction difference that is greater than 0.1, greater than 0.3, greater than 0.5, greater than 0.8, greater than 1.0, greater than 1.5, greater than 2.0, etc. Each one of the first and second materials may be a dielectric material (e.g., silicon, glass, etc.) or a metal material (e.g., silver, aluminum, niobium, titanium dioxide, etc.). Each sublayer within filter 104 may have a high transparency (e.g., greater than 80%, greater than 90%, greater than 95%, greater than 98%, etc.).

As one specific example, sublayers 106-1 and 106-3 may be formed from an optical glass whereas sublayers 106-2 and 106-4 may be formed from silver. Continuing this specific example, sublayer 106-1 may have a thickness of between 500 and 10,000 nanometers (e.g., 5,000 nanometers), sublayer 106-2 may have a thickness of between 10 nanometers and 100 nanometers (e.g., 40 nanometers), sublayer 106-3 may have a thickness of between 100 and 1,000 nanometers (e.g., 550 nanometers), and sublayer 106-4 may have a thickness of between 10 nanometers and 100 nanometers (e.g., 40 nanometers).

The aforementioned example is merely illustrative. In general, the thickness of each sublayer may be greater than 1 nanometer, greater than 20 nanometers, greater than 40 nanometers, greater than 100 nanometers, greater than 1,000 nanometers, greater than 4,000 nanometers, less than 1 nanometer, less than 20 nanometers, less than 40 nanometers, less than 100 nanometers, less than 1,000 nanometers, less than 4,000 nanometers, etc. The total thickness 108 may be greater than 1 nanometer, greater than 20 nanometers, greater than 40 nanometers, greater than 100 nanometers, greater than 1,000 nanometers, greater than 4,000 nanometers, greater than 8,000 nanometers, less than 1 nanometer, less than 20 nanometers, less than 40 nanometers, less than 100 nanometers, less than 1,000 nanometers, less than 4,000 nanometers, less than 8,000 nanometers, etc. The number of sublayers included in filter 104 may be three, four, five, six, more than six, more than eight, more than ten, more than twenty, etc.

Figure 18:
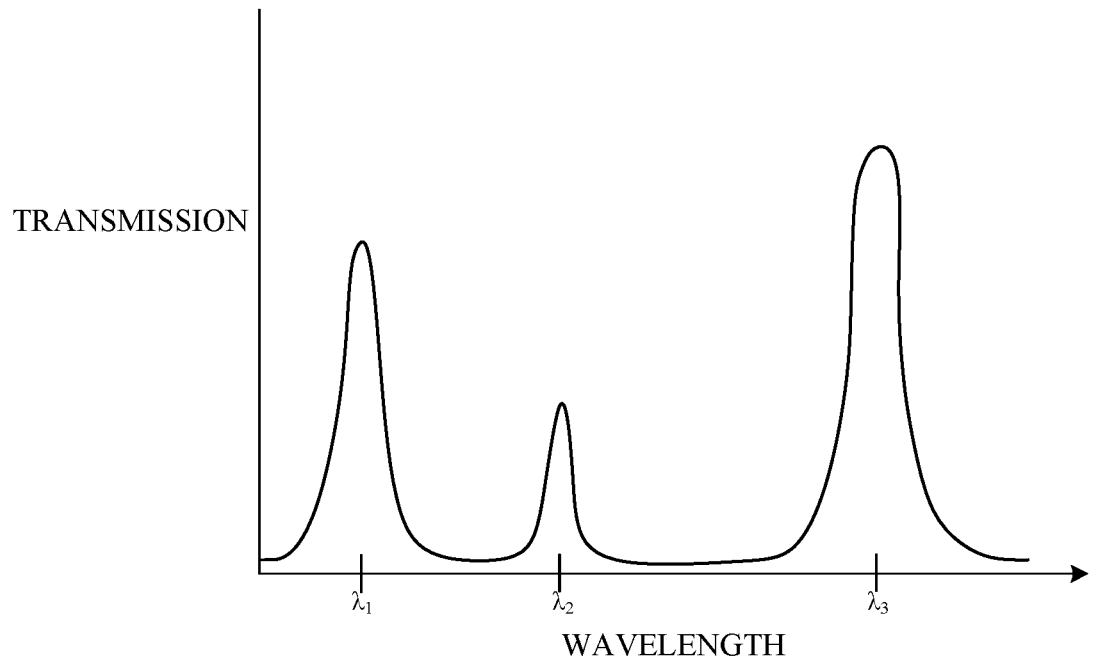
FIG. 18 is a graph of transmission as a function of wavelength at an incident angle that is greater than the critical angle of the interface between water and the display cover layer in accordance with some embodiments of the disclosure.
Figure 19:
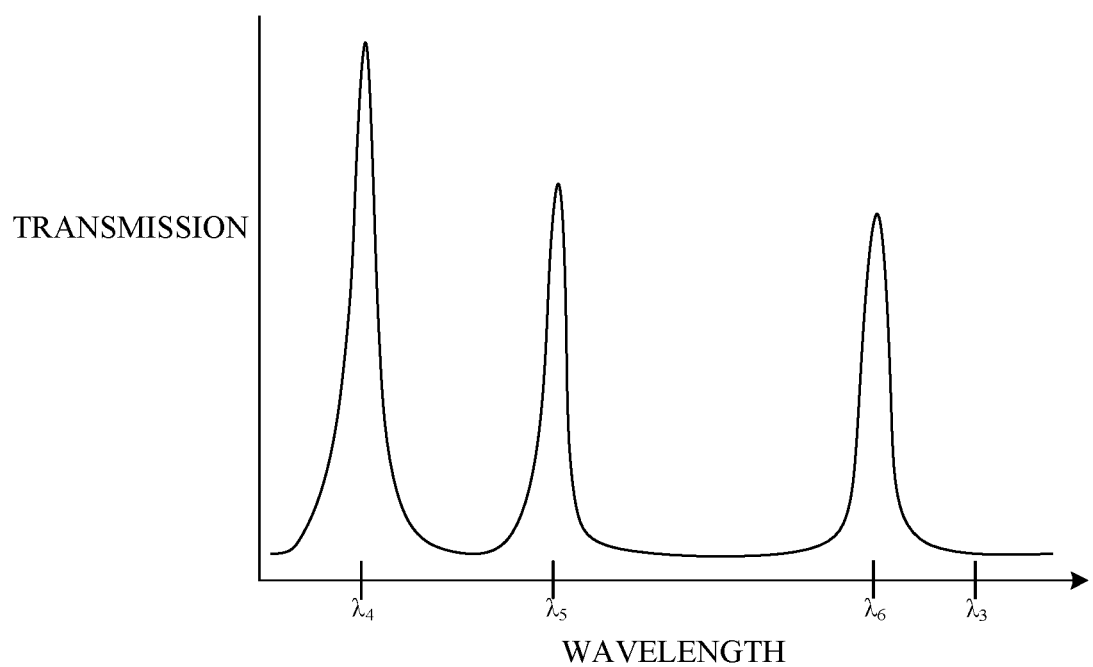
FIG. 19 is a graph of transmission as a function of wavelength at an incident angle that is less than the critical angle of the interface between water and the display cover layer in accordance with some embodiments of the disclosure.

The interference filter 104 for detector 102 may be configured to, at the wavelength emitted by light sources 52 for the optical touch sensor, block incident light at incident angles less than $A_{C2}$ and transmit incident light at incident angles that are greater than $A_{C2}$. FIGS. 18 and 19 are graphs showing the transmission of light through interference filter as a function of wavelength. In particular, FIG. 18 shows the transmission of light through interference filter 104 as a function of wavelength at a first angle (relative to the surface normal which is defined as 0 degrees) that is greater than $A_{C2}$ (e.g., 67 degrees, greater than 62.7 degrees, greater than 65 degrees, etc.) whereas FIG. 19 shows the transmission of light through interference filter as a function of wavelength at a second angle that is less than $A_{C2}$ (e.g., 0 degrees).

As shown in FIG. 18, the interference filter may transmit light at three peaks at an incident angle of 67 degrees: $\lambda_1$, $\lambda_2$, and $\lambda_3$. The largest peak at $\lambda_3$ may be the wavelength of interest (e.g., near infrared light at approximately 950 nanometers that is emitted by the light sources 52). There may be smaller peaks at $\lambda_1$ and $\lambda_2$ within the visible light range (e.g., $\lambda_1$=450 nanometers and $\lambda_2$=630 nanometers).

As shown in FIG. 19, the interference filter may transmit light at three peaks at an incident angle of 0 degrees: $\lambda_4$, $\lambda_5$, and $\lambda_6$. There may be peaks at $\lambda_4$ and $\lambda_5$ within the visible light range (e.g., $\lambda_4$=450 nanometers and $\lambda_5$=600 nanometers). There may also be a peak at $\lambda_6$ around 890 nanometers. Ideally, all light would be blocked at incident angles of 0 degrees. Additional layers may be added to the interference filter to further tune the response. However, this may add additional complexity to the interference filters.

In FIGS. 18 and 19, $\lambda_6$ (with undesirably transmitted light) is less than $\lambda_3$ (with desirably transmitted light). Therefore, an additional filter may be included in series with the interference filter to block the light that is transmitted at the 0 degree incident angle in FIG. 19. For example, the additional filter may block all light at wavelengths of 900 nanometers or smaller (regardless of incident angle). The additional filter may be a near-infrared light bandpass filter that transmits light between 900 nanometers and 1000 nanometers (regardless of incident angle). The additional filter may therefore block the light at wavelengths $\lambda_4$, $\lambda_5$, and $\lambda_6$ in FIG. 19.

FIGS. 18 and 19 show how at an angle (e.g., an off-axis angle) greater than $A_{C2}$ (as in FIG. 18), the angular filter may transmit more light at the wavelength of interest ($\lambda_3$ which is the wavelength emitted by light sources 52) than at an angle (e.g., an on-axis angle) less than $A_{C2}$ (as in FIG. 19).

Figure 20:
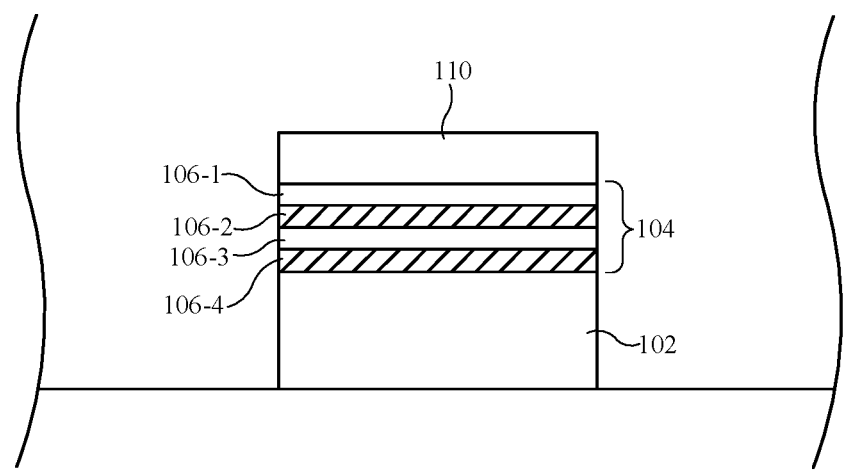
FIG. 20 is a side view of an illustrative light detector that is covered by an interference filter and a visible light blocking filter in accordance with some embodiments of the disclosure.

FIG. 20 is a side view of a detector that is overlapped by an interference filter and an additional filter. As shown in FIG. 20, the additional filter 110 (sometimes referred to as a cut filter, visible light blocking filter, etc.) is formed directly over the detector such that light passes through both the additional filter 110 and the interference filter 104 to reach detector 102. In FIG. 20, interference filter 104 is interposed between filter 110 and detector 102. This example is merely illustrative. Filter 110 may instead be interposed between interference filter 104 and detector 102 if desired (such that filter 110 is in direct contact with detector 102).

Filter 110 may have the same filtering performance regardless of the incident angle of light. Filter 110 may block substantially all (e.g., more than 95% of) visible light. Filter 110 may block substantially all (e.g., more than 95% of) light at wavelengths less than 900 nanometers while passing substantially all (e.g., more than 95% of) light at wavelengths greater than 900 nanometers. This transmission profile is consistent regardless of the incident angle. This is in contrast to interference filter 104, which has a different transmission profile at different incident angles.

A specific example has been described above where an interference filter is formed directly over the detectors 102 in electronic device 10. Interference filters may also be formed over light sources 52. Using interference filters as the angular filters for light sources 52 may mitigate the thickness of the display and avoid blocking pixels that are neighboring the light sources. These interference filters may be configured to transmit light at incident angle A when $-A_{C1}<A<+A_{C1}$ and block light at incident angle A when $A<-A_{C1}$ or $A>+A_{C1}$.

Figure 21:
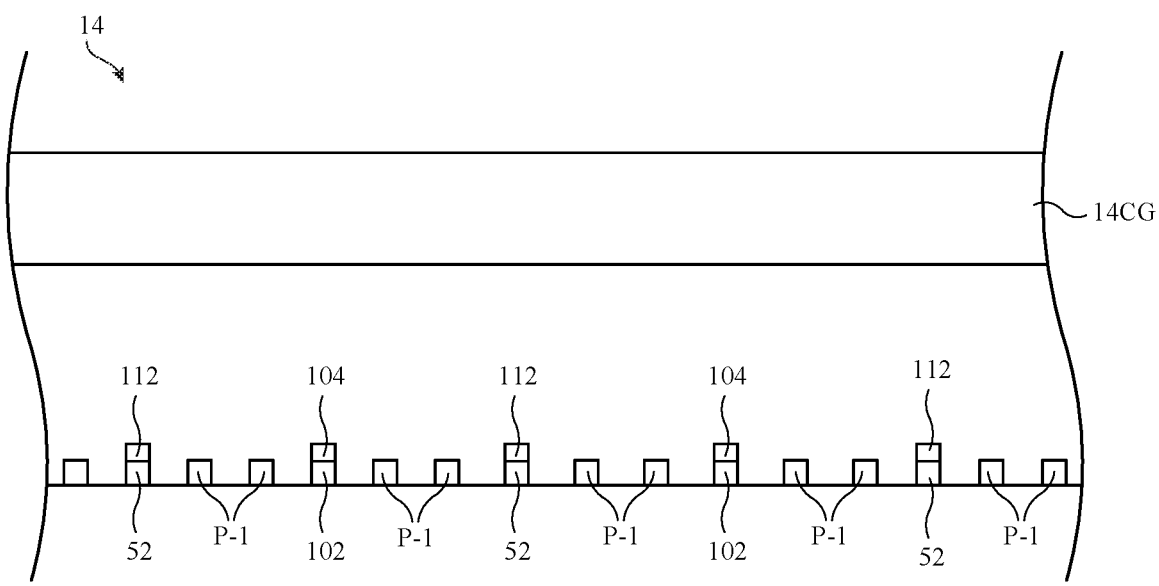
FIG. 21 is a side view of an illustrative optical touch sensor with light sources overlapped by first interference filters and light detectors overlapped by second interference filters in accordance with some embodiments of the disclosure.

FIG. 21 is a side view of an illustrative display with an optical touch sensor that includes first interference filters 104 over detectors 102 and second interference filters 112 over light sources 52. The arrangement of each first interference filter 104 may be the same as the other filters 104 and the arrangement of each second interference filter 112 may be the same as the other filters 112. However, the arrangement of filters 104 and 112 may be different to achieve the target transmission profile for the light sources and the detectors. Interference filters 112 may transmit light at incident angle A when $-A_{C1} < A < +A_{C1}$ and block light at incident angle A when $A < -A_{C1}$ or $A > +A_{C1}$. More generally, interference filters 112 may transmit more light at the wavelength of interest (e.g., $\lambda_3$ as discussed above) at an angle (e.g., an on-axis angle) that is less than $A_{C1}$ than at an angle (e.g., an off-axis angle) that is greater than $A_{C1}$.

Although FIG. 16 illustrates mask layer 88 formed over light detector 102 and separated from the light detector by transparent layer 84, in some instances it can be advantageous to form the mask layer at the photodiode component level, while the photodiode component is being fabricated. By doing so, the formation of mask layer 88 can be isolated from the display assembly process, and the mask layer can become part of the modularized photodiode component, thereby easing the challenges of forming the mask layer at a higher level of integration. Forming mask layer 88 within the photodiode component also miniaturizes the mask layer to produce a smaller footprint, and in some instances component-level fabrication processes can enable formation of the mask layer with greater accuracy than at the display assembly level. In contrast, forming mask layer 88 at the display assembly level requires that the mask layer be formed at a greater height above the photosensitive surface of the photodiode as compared to the photodiode component level, which in turn requires that the mask layer be larger and consume more display surface area.

Figure 22A:
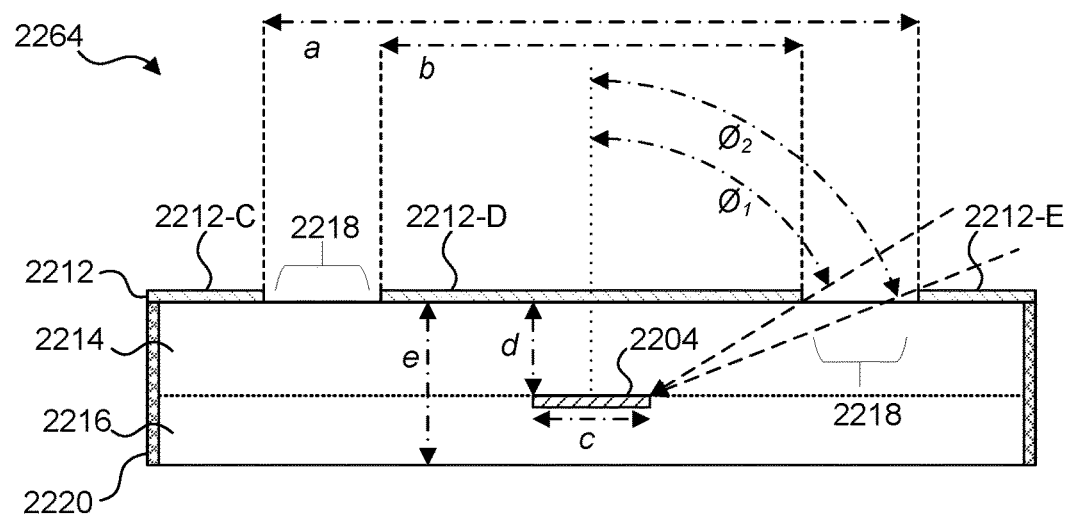
FIG. 22A illustrates a cross-sectional view of a photodiode including a photosensitive surface and a top light blocking layer formed on a first layer in accordance with some embodiments of the disclosure.

FIG. 22A illustrates a cross-sectional view of photodiode 2264 (e.g., detector 102 of FIG. 16) including photosensitive surface 2204 and top light blocking layer 2212 formed on first layer 2214 in accordance with some embodiments of the disclosure. Note that the term photodiode, as used herein, is a light-sensitive semiconductor diode inclusive of an LED, micro-LED, or other diode configured as a light detector. Photodiode 2264 can have a thickness e, and can include photodiode substrate or body 2216 and photosensitive surface 2204 located in a confined area in the photodiode substrate or body. Although not evident in the example of FIG. 22A, photosensitive surface 2204 has a surface area for receiving incoming light rays. Photodiode body 2216 can include a p+ area (photosensitive surface 2204), a depletion region, and an n-type substrate that together form a semi-conductor p-n junction, and can also include an n material and a metal contact, most of which are not shown in FIG. 22A for purposes of simplifying the figure. Photosensitive surface 2204 can be created by blocking areas of photodiode body 2216 other than the area of the photosensitive surface using an opaque mask layer (not shown in FIG. 6E) formed over the photodiode body. The opaque mask can be formed from opaque material (e.g., metal) using masking, ion implantation, etc.

In the example of FIG. 22A, during the photodiode fabrication process, first layer 2214 can be formed over photosensitive surface 2204 and photodiode body 2216. First layer 2214 can be optically transparent, at least at the wavelengths of interest of the received light rays. In various examples, first layer 2214 can be a passivation layer deposited over photosensitive surface 2204 and photodiode body 2216, or alternatively an epoxy, a filter, or a grown oxide having a thickness of several microns. Because photodiode 2264 will operate within a certain range of wavelengths, in some examples, first layer 2214 can be a wavelength selective filter (e.g., a color filter) that can pass light within the same range of wavelengths that are generated by corresponding LEDs configured as illuminators, so that the photodiodes will not receive much light from sources other than the reflected light from the illuminators. In one example, the LEDs can be configured to generate light in the infrared or near-infrared spectrum. In another example, the LEDs can be configured to generate light in the visible spectrum. In one illustrative example, first layer 2214 can be a thin film filter that is formed from Silicon Nitride (SiN) having a refractive index of about 1.7-2.2.

An opaque mask layer such as top light blocking layer 2212 can then be formed over first layer 2214 during the photodiode component fabrication process to permit only certain angles of light to reach photosensitive surface 2204. Top light blocking layer 2212 can be formed from opaque material (e.g., metal) using masking, ion implantation, etc. In some examples, top light blocking layer 2212 can allow only about 0.01% of received light to pass through. In some examples, top light blocking layer 2212 can also be absorptive, reflecting not more than about 1% of received light.

Although the preceding discussion describes received light rays with permitted angles ("receive angles") of greater than +/−62.7 degrees (indicative of a touching finger or stylus) from a photodiode surface normal (e.g., normal to a top surface of the photodiode, which can be the same as the normal to photosensitive surface 2204), allowing all angles between +/−62.7 degrees may permit some undesirable reflections and refractions to be detected by photodiode 2264. Thus, top light blocking layer 2212 can include not only inner mask baffle 2212-D (e.g., mask 88 of FIG. 16), but also outer mask portions 2212-C and 2212-E to act as an angular filter and limit the receive angles to narrow ranges, such as within a specific number of degrees (e.g., within 10 degrees, 5 degrees, one degree, etc.) or some fixed percentage (e.g., within 20%, 10%, 5%, etc.) of +/−62.7 degrees. In one specific example for purposes of illustration only, inner mask baffle 2212-D in conjunction with outer mask portions 2212-C and 2212-E can pass light between a first receive angle of 65 degrees and a second receive angle of 75 degrees. Inner mask baffle 2212-D can be formed above photosensitive surface 2204 (e.g., separated from the photosensitive surface by first layer 2214 in a vertical direction) and can extend beyond the photosensitive surface (e.g., extend beyond the edges of the photosensitive surface in a horizontal direction). Note that although outer mask portions 2212-C and 2212-E appear to be separate portions in the cross-sectional view of FIG. 6E, they are actually continuously connected as one outer mask portion that encircles inner mask baffle 2212-D. Aperture 2218 can be created in areas of first layer 2214 that are not covered by inner mask baffle 2212-D or outer mask portions 2212-C and 2212-E.

Inner mask baffle 2212-D and outer mask portions 2212-C and 2212-E can be formed with diameters a and b to create aperture 2218 that permits only a range of receive angles between a first receive angle $\varnothing_1$ and a second receive angle $\varnothing_2$ to reach photosensitive surface 2204, such as within a specific number of degrees (e.g., within 10 degrees, 5 degrees, one degree, etc.) or some fixed percentage (e.g., within 20%, 10%, 5%, etc.) of +/−62.7 degrees. The generalized diameter equation is:

$$\text{diameter} = 2*d*\tan(\varnothing) + c \qquad (1)$$

where c is the width or diameter of photosensitive surface 2204, and d is the distance between the photosensitive surface and inner mask baffle 2212-D.

The generalized diameter equation (1) can be utilized with dimensions c (width of photosensitive surface 2204) and d (the distance between the photosensitive surface and top light blocking layer 2212) to compute diameters a and b. In various examples, diameter a can be in the range of 10-50 microns, the thickness d of first layer 2214 can be in the range of 1-5 microns, and the width or diameter c of photosensitive surface 2204 can be in the range of 2.55-66 microns. Table I below lists some example dimensions of photodiode 2264:

TABLE I

| Photosensitive Surface 2204 x-y Dimensions | Photodiode thickness e |
|---|---|
| 2.5 μm × 2.5 μm | 2.5 μm |
| 5 μm × 5 μm | 3 μm |
| 12 μm × 12 μm | 2.5 μm or 4.5 μm |
| 15 μm × 15 μm | 3 μm |
| 22 μm × 22 μm | 2.5 μm or 4.5 μm |
| 25 μm × 25 μm | 3 μm |
| 30 μm × 30 μm | 4 μm |
| 33 μm × 33 μm | 5 μm |
| 33 μm × 66 μm | 5 μm |

In some examples, the maximum area of photosensitive surface 2204 can be limited to 50 μm×100 μm, and the photosensitive surface can be centered in the x dimension with respect to the package. In one example for purposes of illustration only, for a first receive angle $Ø_1$ of 65 degrees, the diameter b=4.29d+c, and for a second receive angle $Ø_2$ of 75 degrees, the diameter a=7.46d+c. In another example, the dimensions c and d can be selected to produce a first receive angle $Ø_1$ of 62.7 degrees, and a second receive angle $Ø_2$ that is a fixed percentage or a fixed number of degrees greater than the first receive angle $Ø_1$ (e.g., 10 degrees greater or 72.7 degrees, or 20% greater or 75 degrees, etc.).

LEDs in close proximity to photodiode 2264 can emit light that is intended to reflect off a touching or hovering object such as a finger or a stylus and back to the photodiode. In some examples, to ensure that light emitted from proximate LEDs does not travel directly to photodiode 2264 and be erroneously detected by photosensitive surface 2204, the photodiode can include side light blocking layers 2220 to block this stray light. Side light blocking layers 2220 can be formed from opaque material (e.g., metal) using masking, ion implantation, etc. In some examples, side light blocking layers 2220 can allow only about 0.01% of received light to pass through. In some examples, side light blocking layers 2220 can also be absorptive, reflecting not more than about 1% of received light. Note that FIG. 22A and its description herein may omit certain layers and assembly/fabrication processes for purposes of simplifying the disclosure.

Figure 22B:
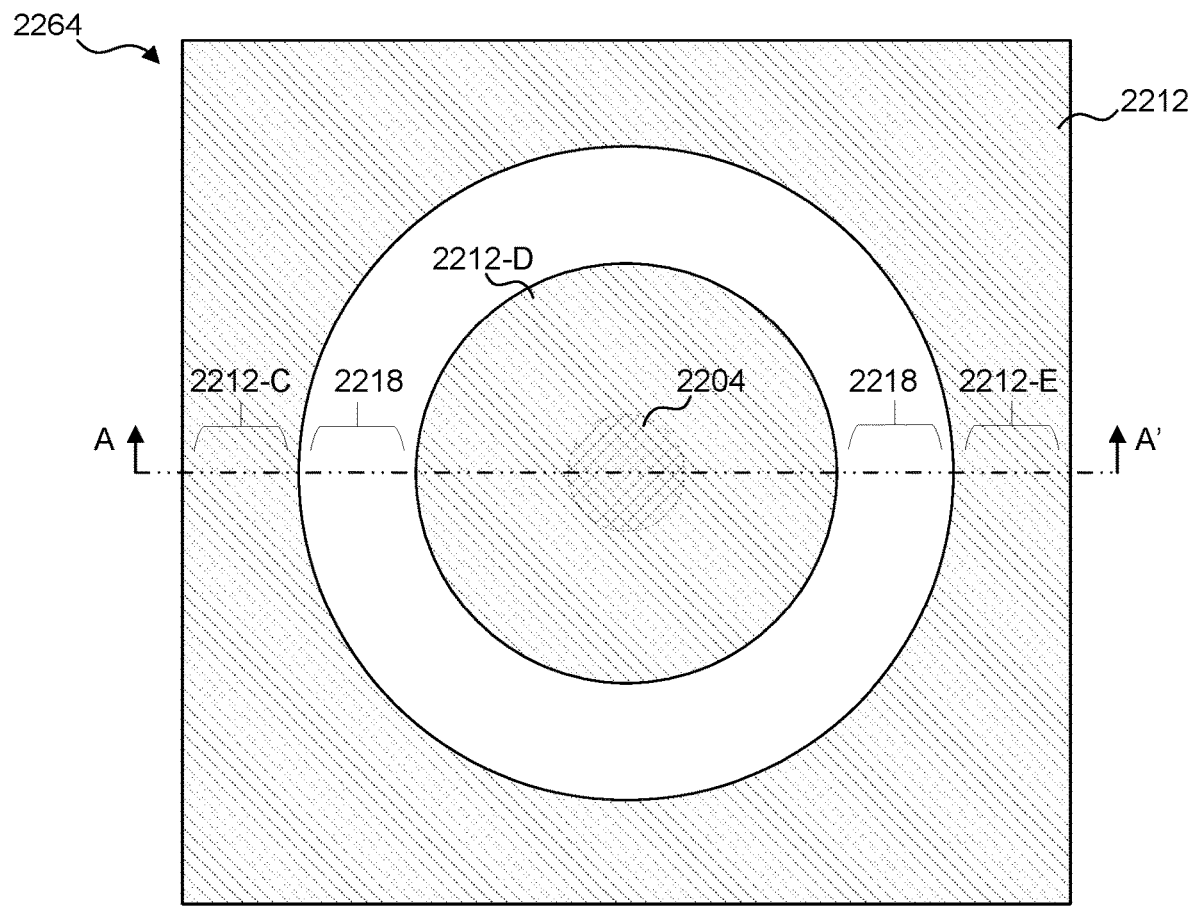
FIG. 22B illustrates a top view of the photodiode of FIG. 22A showing the top light blocking layer in accordance with some embodiments of the disclosure.

FIG. 22B illustrates a top view of photodiode 2264 of FIG. 22A showing top light blocking layer 2212 in accordance with some embodiments of the disclosure. Note that the cross-sectional view of FIG. 22A is taken along the view A-A of FIG. 22B, and that photosensitive surface 2204 of FIG. 22A is shown in FIG. 22B as being hidden beneath inner mask baffle 2212-D. From the top view of FIG. 22B, it can be seen that aperture 2218 can be ring-shaped (e.g., an annulus) that encircles photosensitive surface 2204 from above (e.g., separated from the photosensitive surface by first layer 2214 in a vertical direction).

Figure 22C:
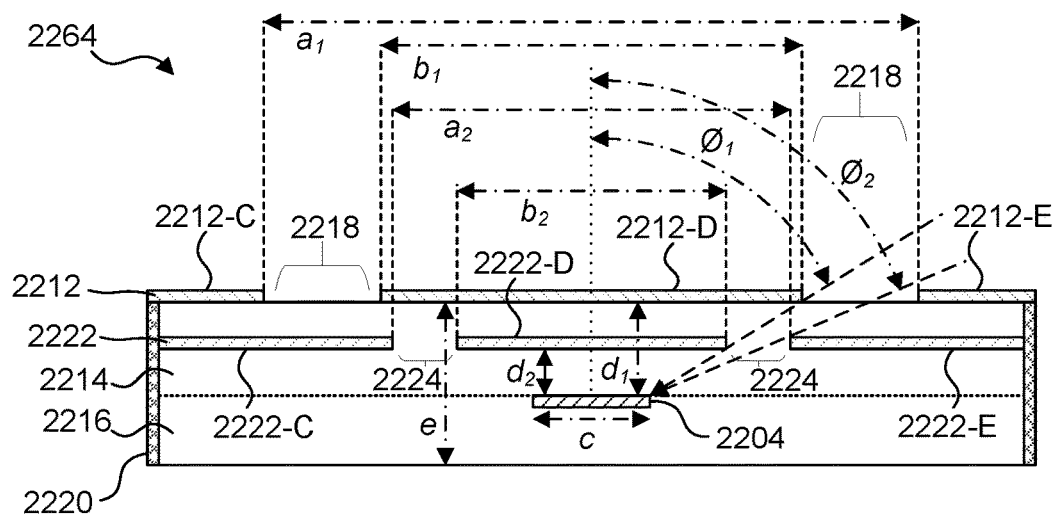
FIG. 22C illustrates a cross-sectional view of a photodiode including a photosensitive surface, a second light blocking layer formed within a first layer, and a top light blocking layer formed on top of the first layer in accordance with some embodiments of the disclosure.

FIG. 22C illustrates a cross-sectional view of photodiode 2264 including photosensitive surface 2204, second light blocking layer 2222 formed within first layer 2214, and top light blocking layer 2212 formed on top of the first layer in accordance with some embodiments of the disclosure. Photodiode 2264 can have a thickness e, and can include photodiode substrate or body 2216 and photosensitive surface 2204 located in a confined area on the photodiode substrate or body. Although not evident in the example of FIG. 22C, photosensitive surface 2204 has a surface area for receiving incoming light rays. Photosensitive surface 2204 can be created by blocking areas of photodiode body 2216 other than the area of the photosensitive surface using an opaque mask (not shown in FIG. 22C) formed over the photodiode body. The opaque mask can be formed from opaque material (e.g., metal) using masking, ion implantation, etc.

The addition of second light blocking layer 2222 can provide for better control of the angles of light received at photosensitive surface 2204, and better control of the detection area on the photosensitive surface. For example, with reference to FIG. 22A, light rays entering from the right of photodiode 2264 (with reference to the viewpoint of FIG. 22A) may impinge upon many different areas of photosensitive surface 2204, including areas along the left side of the photosensitive surface, depending on the angle of incident light. In contrast, with reference to FIG. 22C, light rays entering from the right side of photodiode 2264 (with reference to the viewpoint of FIG. 22C) will impinge upon fewer areas of photosensitive surface 2204, and potentially no areas along the left side of the photosensitive surface, even with varying angles of incident light, due to the further restriction of light angles caused by the presence of second light blocking layer 2222. In some examples, second light blocking layer 2222 can also advantageously absorb some of the tolerances and misalignments that occur during photodiode processing and allow photosensitive surface 2204 to be manufactured with a smaller than nominal size.

During the photodiode fabrication process, a first portion of first layer 2214 can be formed over photosensitive surface 2204 and photodiode body 2216. In various examples, first layer 2214 can be a passivation layer deposited over photosensitive surface 2204 and photodiode body 2216, or alternatively an epoxy, a filter, or a grown oxide having a thickness of several microns. Because photodiode 2264 will operate within a certain range of wavelengths, in some examples, first layer 2214 can be a wavelength selective filter (e.g., a color filter) that can receive light within the same range of wavelengths that are generated by corresponding LEDs configured as illuminators, so that the photodiodes will not receive much light from sources other than the reflected light from the illuminators. In one illustrative example, first layer 2214 can be a thin film filter formed from Silicon Nitride (SiN) having a refractive index of about 1.7-2.2.

An opaque mask layer such as second light blocking layer 2222 can then be formed over the first portion of first layer 2214 during the photodiode component fabrication process to permit only certain angles of light to reach photosensitive surface 2204. Second light blocking layer 2222 can be formed from opaque material (e.g., metal) using masking, ion implantation, etc. In some examples, second light blocking layer 2222 can allow only about 0.01% of received light to pass through. In some examples, second light blocking layer 2222 can also be absorptive, reflecting not more than about 1% of received light. Second light blocking layer 2222 can include inner mask baffle 2222-D and outer mask portions 2222-C and 2222-E. Inner mask baffle 2222-D can be formed above photosensitive surface 2204 (e.g., separated from the photosensitive surface by the first portion of first layer 2214 in a vertical direction) and can extend beyond the photosensitive surface (e.g., extend beyond the edges of the photosensitive surface in a horizontal direction). Note that although outer mask portions 2222-C and 2222-E appear to be separate portions in the cross-sectional view of FIG. 22C, they are actually continuously connected as one outer mask portion that encircles inner mask baffle 2222-D. Aperture 2224 can be formed between inner mask baffle 2222-D and outer mask portions 2222-C and 2222-E.

As noted above, although received light rays with receive angles of greater than +/−62.7 degrees (with respect to the photodiode surface normal) can be indicative of a finger or stylus touch, allowing all receive angles between +/−62.7 degrees may permit some undesirable reflections and refractions to be detected by photosensitive surface 2204 of photodiode 2264. Thus, inner mask baffle 2222-D and outer mask portions 2222-C and 2222-E can be formed with diameters $a_2$ and $b_2$ to create aperture 2224 that act as an angular filter and permits only a range of receive angles between a first receive angle $\emptyset_1$ and a second receive angle $\emptyset_2$ to reach photosensitive surface 2204, such as within a specific number of degrees (e.g., within 10 degrees, 5 degrees, one degree, etc.) or some fixed percentage (e.g., within 20%, 10%, 5%, etc.) of +/−62.7 degrees. The generalized diameter equation (1) shown above can be utilized with dimensions c (width or diameter of photosensitive surface 2204) and $d_2$ (the distance between the photosensitive surface and second light blocking layer 2222) to compute diameters $a_2$ and $b_2$.

A second portion of first layer 2214 can then be formed over second light blocking layer 2222. Another opaque mask layer such as top light blocking layer 2212 can then be formed over the second portion of first layer 2214 during the photodiode component fabrication process to permit only certain angles of light to reach photosensitive surface 2204. Top light blocking layer 2212 can be formed from opaque material (e.g., metal) using masking, ion implantation, etc. In some examples, top light blocking layer 2212 can allow only about 0.01% of received light to pass through. In some examples, top light blocking layer 2212 can also be absorptive, reflecting not more than about 1% of received light. Top light blocking layer 2212 can include inner mask baffle 2212-D and outer mask portions 2212-C and 2212-E. Inner mask baffle 2212-D can be formed above photosensitive surface 2204 (e.g., separated from the photosensitive surface by both the first and second portions of first layer 2214 in a vertical direction) and can extend beyond photosensitive surface 2204 (e.g., extend beyond the edges of the photosensitive surface in a horizontal direction). Note that although outer mask portions 2212-C and 2212-E appear to be separate portions in the cross-sectional view of FIG. 22C, they are actually continuously connected as one outer mask portion that encircles inner mask baffle 2212-D. Aperture 2218 can be created in areas of the second portion of first layer 2214 that are not covered by inner mask baffle 2212-D or outer mask portions 2212-C and 2212-E.

Inner mask baffle 2212-D and outer mask portions 2212-C and 2212-E can be formed with diameters $a_1$ and $b_1$ to create aperture 2218 that act as an angular filter and permits the same range of receive angles (e.g., between $\emptyset_1$ and $\emptyset_2$) as inner mask baffle 2222-D and outer mask portions 2222-C and 2222-E to reach photosensitive surface 2204, such as within a specific number of degrees (e.g., within 10 degrees, 5 degrees, one degree, etc.) or some fixed percentage (e.g., within 20%, 10%, 5%, etc.) of +/−62.7 degrees. The generalized diameter equation (1) shown above can be utilized with dimensions c (width of photosensitive surface 2204) and $d_1$ (the distance between the photosensitive surface and top light blocking layer 2212) to compute diameters $a_1$ and $b_1$. In one example for purposes of illustration only, for a first receive angle $\emptyset_1$ of 65 degrees, the diameter $b_1=4.29d_1+c$, and for an angle $\emptyset_2$ of 75 degrees, the diameter $a_1=7.46d_1+c$. In another example, the dimensions c and $d_1$ can be selected to produce a first receive angle $\emptyset_1$ of 62.7 degrees, and a second receive angle $\emptyset_2$ that is a fixed percentage or a fixed number of degrees greater than $\emptyset_1$ (e.g., 10 degrees greater or 72.7 degrees, or 20% greater or 75 degrees, etc.).

As described above, LEDs in close proximity to photodiode 2264 can emit light that is intended to reflect off a touching or hovering object such as a stylus and back to the photodiode. In some examples, to ensure that light emitted from such proximate LEDs does not travel directly to photodiode 2264 and be erroneously detected by photosensitive surface 2204, the photodiode can include side light blocking layers 2220 to block this stray light. Side light blocking layers 2220 can be formed from opaque material (e.g., metal) using masking, ion implantation, etc. In some examples, side light blocking layers 2220 can allow only about 0.01% of received light to pass through. In some examples, side light blocking layers 2220 can also be absorptive, reflecting not more than about 1% of received light. Note that FIG. 22C and its description herein may omit certain layers and assembly/fabrication processes for purposes of simplifying the disclosure.

Figure 22D:
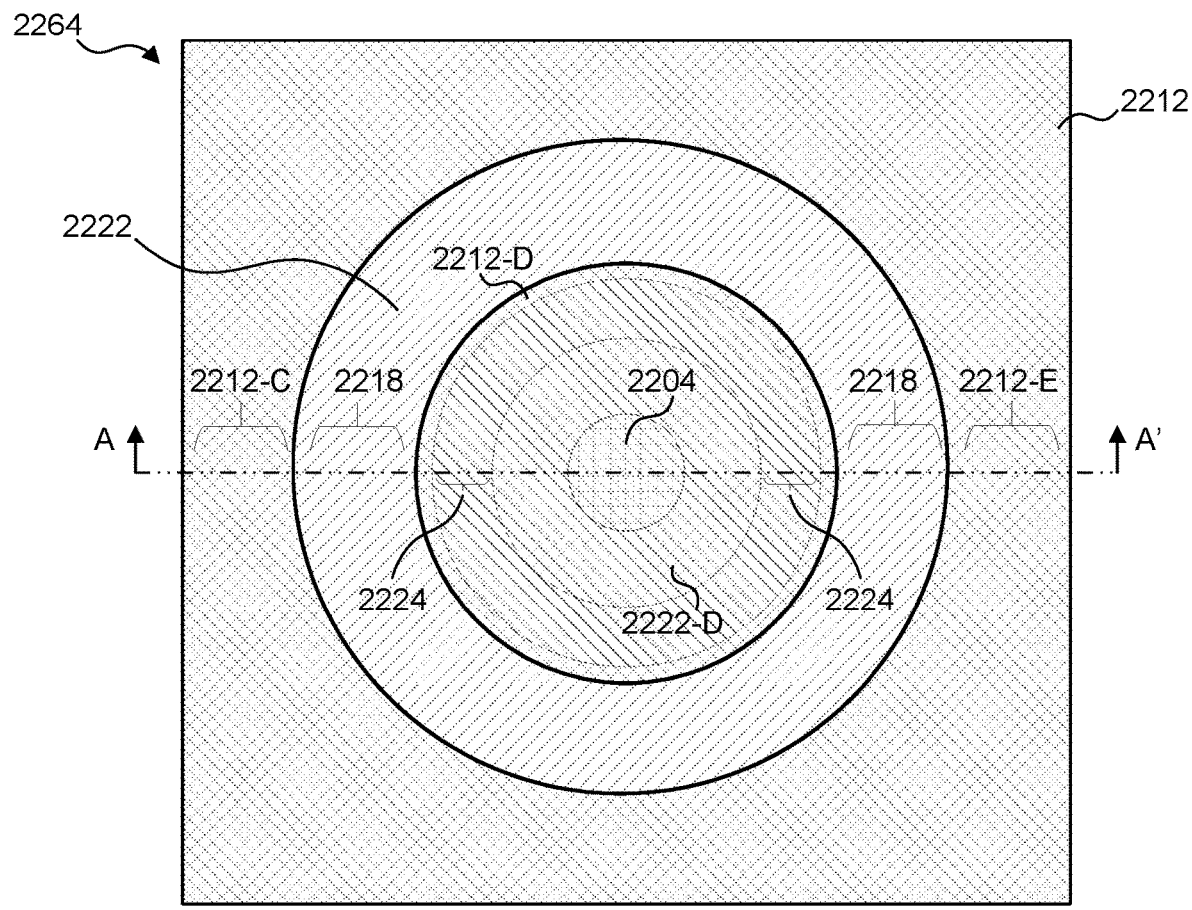
FIG. 22D illustrates a top view of the photodiode of FIG. 22C showing the top light blocking layer and a portion of the second light blocking layer showing through an aperture in accordance with some embodiments of the disclosure.

FIG. 22D illustrates a top view of photodiode 2264 of FIG. 22C showing top light blocking layer 2212 and a portion of second light blocking layer 2222 showing through aperture 2218 in accordance with some embodiments of the disclosure. Note that the cross-sectional view of FIG. 22C is taken along the view A-A of FIG. 22D, and that photosensitive surface 2204, inner mask baffle 2222-D, and aperture 2224 of FIG. 22C are shown as being hidden beneath inner mask baffle 2212-D. From the top view of FIG. 22D, it can be seen that apertures 2218 and 2224 can be ring-shaped (e.g., an annulus) that encircles photosensitive surface 2204 from above (e.g., separated from the photosensitive surface by first layer 2214 in a vertical direction).

Figure 22E:
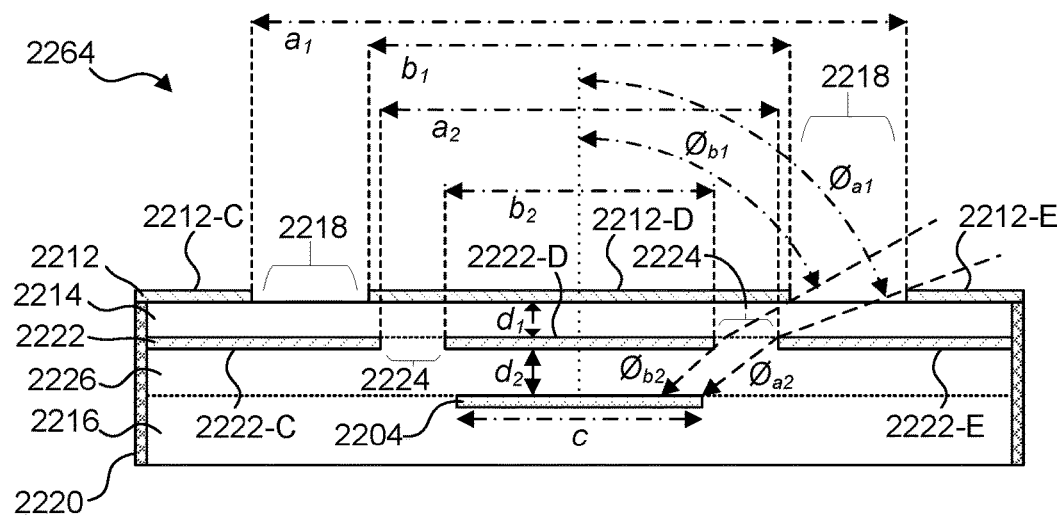
FIG. 22E illustrates a cross-sectional view of a photodiode including a photosensitive surface, a second light blocking layer formed on a second layer having a second refractive index n2, and a top light blocking layer formed on a first layer having a first refractive index n1 in accordance with some embodiments of the disclosure.

FIG. 22E illustrates a cross-sectional view of photodiode 2264 including photosensitive surface 2204, second light blocking layer 2222 formed on second layer 2226 having a second refractive index n2, and top light blocking layer 2212 formed on first layer 2214 having a first refractive index n1 in accordance with some embodiments of the disclosure. Second layer 2226 can be optically transparent, at least at the wavelengths of interest of the received light rays. Photodiode 2264 can include photodiode substrate or body 2216 and photosensitive surface 2204 located in a confined area on the photodiode substrate or body. Although not evident in the example of FIG. 22E, photosensitive surface 2204 has a surface area for receiving incoming light rays. Photosensitive surface 2204 can be created by blocking areas of photodiode body 2216 other than the area of the photosensitive surface using an opaque mask (not shown in FIG. 22E) formed over the photodiode body. The opaque mask can be formed from opaque material (e.g., metal) using masking, ion implantation, etc.

The addition of second layer 2226 with a refractive index n2 that is different from the refractive index n1 of first layer 2214 can provide for better control of the angles of light received at photosensitive surface 2204 by virtue of the "bending" of light rays as they refract across the layer boundary. This increased control of light rays can allow for a photosensitive surface 2204 with a larger surface area and an advantageous increase in light detection sensitivity. For example, with reference to FIG. 22E, light rays entering from the right of photodiode 2264 (with reference to the viewpoint of FIG. 22E) at entry angles between $\emptyset_{b1}$ and $\emptyset_{a1}$ may decrease in angle (with respect to the photodiode surface normal) to between $\emptyset_{b2}$ and $\emptyset_{a2}$ as they cross the boundary between first layer 2214 and second layer 2226. This decrease in angle (e.g., increase in steepness) can allow for the diameter c of photosensitive surface 2204 to increase, while still capturing only those light rays with photodiode entry angles between $\emptyset_{b1}$ and $\emptyset_{a1}$.

During the photodiode fabrication process, second layer 2226 having a refractive index of n2 can be formed over photosensitive surface 2204 and photodiode body 2216. In various examples, second layer 2226 can be a passivation layer deposited over photosensitive surface 2204 and photodiode body 2216, or alternatively the second layer can be an epoxy, a filter, or a grown oxide having a thickness of several microns. Because photodiode 2264 will operate within a certain range of wavelengths, in some examples, second layer 2226 can be a wavelength selective filter (e.g., a color filter) that can receive light within the same range of wavelengths that are generated by corresponding LEDs configured as illuminators, so that the photodiodes will not receive much light from sources other than the reflected light from the illuminators.

An opaque mask layer such as second light blocking layer 2222 can then be formed over the first portion of second layer 2226 during the photodiode component fabrication process to permit only certain angles of light to reach photosensitive surface 2204. Second light blocking layer 2222 can be formed from opaque material (e.g., metal) using masking, ion implantation, etc. In some examples, second light blocking layer 2222 can allow only about 0.01% of received light to pass through. In some examples, second light blocking layer 2222 can also be absorptive, reflecting not more than about 1% of received light. Second light blocking layer 2222 can include inner mask baffle 2222-D and outer mask portions 2222-C and 2222-E. Inner mask baffle 2222-D can be formed over photosensitive surface 2204 (e.g., separated from the photosensitive surface by second layer 2226 in a vertical direction) and can extend beyond the photosensitive surface (e.g., extend beyond the edges of the photosensitive surface in a horizontal direction). Note that although outer mask portions 2222-C and 622-E appear to be separate portions in the cross-sectional view of FIG. 22E, they are actually continuously connected as one outer mask portion that encircles inner mask baffle 2222-D. Aperture 2224 can be created in areas of second layer 626 that are not covered by inner mask baffle 2222-D and or mask portions 2222-C and 2222-E.

First layer 2214 can then be formed over second layer 2226 and second light blocking layer 2222. Another opaque mask layer such as top light blocking layer 2212 can then be formed over first layer 2214 during the photodiode component fabrication process to permit only certain angles of light to reach photosensitive surface 2204. Top light blocking layer 2212 can be formed from opaque material (e.g., metal) using masking, ion implantation, etc. In some examples, top light blocking layer 2212 can allow only about 0.01% of received light to pass through. In some examples, top light blocking layer 2212 can also be absorptive, reflecting not more than about 1% of received light. Top light blocking layer 2212 can include inner mask baffle 2212-D and outer mask portions 2212-C and 2212-E. Inner mask baffle 2212-D can be formed above photosensitive surface 2204 (e.g., separated from the photosensitive surface by first layer 2214 and second layer 2226 in a vertical direction) and can extend beyond the photosensitive surface 2204 (e.g., extend beyond the edges of the photosensitive surface in a horizontal direction). Note that although outer mask portions 2212-C and 2212-E appear to be separate portions in the cross-sectional view of FIG. 22E, they are actually continuously connected as one outer mask portion that encircles inner mask baffle 2212-D. Aperture 2218 can be created in areas of first area 614 that are not covered by inner mask baffle 2212-D or outer mask portions 2212-C and 2212-E.

As noted above, although received light rays with receive angles of greater than +/−62.7 degrees (with respect to the photodiode surface normal) can be indicative of a stylus, allowing all receive angles between +/−62.7 degrees may permit some undesirable reflections and refractions to be detected by photosensitive surface 2204 of photodiode 2264. Thus, inner mask baffle 2212-D and outer mask portions 2212-C and 2212-E of top light blocking layer 2212 can be formed with diameters $a_1$ and $b_1$ to create aperture 2218 that act as an angular filter and permits only a range of receive angles between first receive angle $\emptyset_{b1}$ and second receive angle $\emptyset_{a1}$ to reach photosensitive surface 2204, such as within a specific number of degrees (e.g., within 10 degrees, 5 degrees, one degree, etc.) or some fixed percentage (e.g., within 20%, 10%, 5%, etc.) of +/−62.7 degrees. Additionally, inner mask baffle 2222-D and outer mask portions 2222-C and 2222-E of second light blocking layer 2222 can be formed with diameters $a_2$ and $b_2$ to create aperture 2224 that, in conjunction with the light rays having a range of receive angles between $\emptyset_{b1}$ and $\emptyset_{a1}$ passing through first layer 2214, allow a larger diameter photosensitive surface 2204 to be utilized while still only capturing those light rays with entry angles between $\emptyset_{b1}$ and $\emptyset_{a1}$.

Given a desired range of incoming light ray receive angles between $\emptyset_{b1}$ and $\emptyset_{a1}$, the refracted light ray receive angles in second layer 2226 can be computed as:

$$\emptyset_{a2} = a\sin(n1/n2 * \sin(\emptyset_{a1})) \quad (2)$$

$$\emptyset_{b2} = a\sin(n1/n2 * \sin(\emptyset_{b1})) \quad (3)$$

and the average light ray receive angle in second layer 2226 can be computed as:

$$\emptyset_2(\text{average angle in second layer 2214}) = (\emptyset_{a2} + \emptyset_{b2})/2 \quad (4)$$

In some examples, the material and refractive index of second layer 2226 can be selected for increased antireflective index matching between first layer 2214 (having a refractive index of n1) and photodiode body 2216 (having a refractive index of np). Ideally, the refractive index n2 of second layer 2226 can be selected such that:

$$n2 = sqrt(n1 * np) \quad (5)$$

In addition, for light having a wavelength L, the thickness d2 of second layer 2226 can be computed as:

$$d2 = L\cos(\emptyset_2)/4/n2 \quad (6)$$

More generally, in all display level and photodiode component level embodiments described herein, the materials can be selected to have similar refractive indices to minimize unwanted reflections between material boundaries.

The generalized diameter equation (1) shown above can be utilized with dimensions c (width of photosensitive surface 2204), $d_2$ (the thickness of second layer 2226), and $d_1$ (the thickness of first layer 2214) to compute diameters $a_2$, $b_2$, $a_1$, and $b_1$ as follows:

$$b_2 = 2 * d_2 * \tan(\varnothing_{b2}) + c \quad (7)$$

$$a_2 = 2 * d_2 * \tan(\varnothing_{a2}) + c \quad (8)$$

$$b_1 = 2 * d_1 * \tan(\varnothing_{b1}) + b_2 \quad (9)$$

$$a_1 = 2 * d_1 * \tan(\varnothing_{a1}) + a_2 \quad (10)$$

As described above, LEDs in close proximity to photodiode 2264 can emit light that is intended to reflect off a touching or hovering object such as a stylus and back to the photodiode. In some examples, to ensure that light emitted from such proximate LEDs does not travel directly to photodiode 2264 and be erroneously detected by photosensitive surface 2204, the photodiode can include side light blocking layers 2220 to block this stray light. Side light blocking layers 2220 can be formed from opaque material (e.g., metal) using masking, ion implantation, etc. In some examples, side light blocking layers 2220 can allow only about 0.01% of received light to pass through. In some examples, side light blocking layers 2220 can also be absorptive, reflecting not more than about 1% of received light. Note that FIG. 22E and its description herein may omit certain layers and assembly/fabrication processes for purposes of simplifying the disclosure.

Figure 22F:
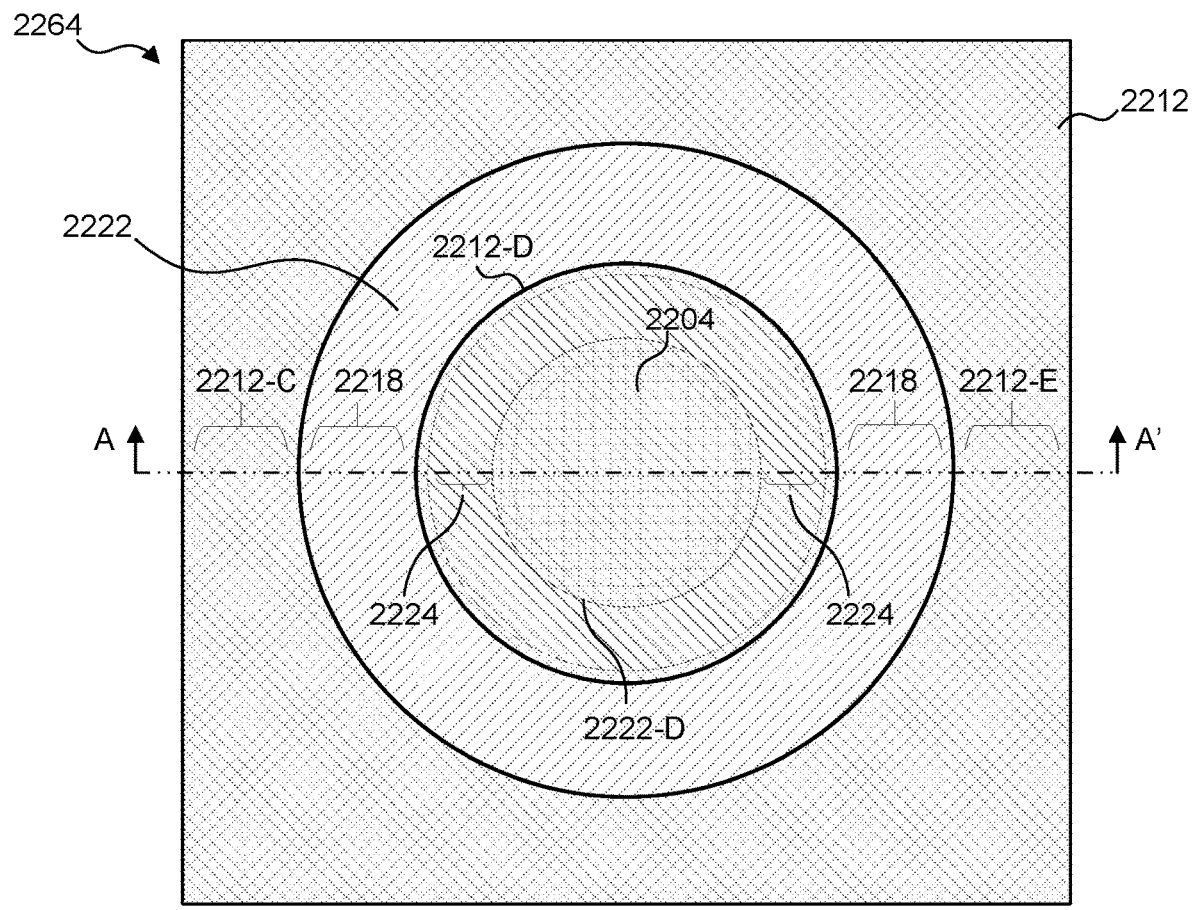
FIG. 22F illustrates a top view of the photodiode of FIG. 22E showing the top light blocking layer and a portion of the second light blocking layer showing through an aperture in accordance with some embodiments of the disclosure.

FIG. 22F illustrates a top view of photodiode 2264 of FIG. 22E showing top light blocking layer 2212 and a portion of second light blocking layer 2222 showing through aperture 2218 in accordance with some embodiments of the disclosure. Note that the cross-sectional view of FIG. 22E is taken along the view A-A of FIG. 22F, and that photosensitive surface 2204, inner mask baffle 2222-D, and aperture 2224 of FIG. 22F are shown as being hidden beneath inner mask baffle 2212-D. From the top view of FIG. 22F, it can be seen that apertures 2218 and 2224 can be ring-shaped (e.g., an annulus) that encircles photosensitive surface 2204 from above (e.g., separated from the photosensitive surface in a vertical direction).

In the examples of FIGS. 22A-22F discussed above, an aperture can be formed on one or more layers of photodiode 2264 to permit light rays within a range of angles to impinge upon photosensitive surface 2204. However, in some instances, light rays within the desired range of angles may only impinge upon a small portion of photosensitive surface 2204, such as only along the perimeter of the photosensitive surface. As a result, the amount of light detected by that photodiode may be sub-optimal. Therefore, in some instances it can be advantageous to detect more light within the desired range of angles at a single photodiode. To achieve this, some embodiments of the disclosure can employ multiple photosensitive surfaces and multiple apertures within a single photodiode to increase the opportunities to receive light rays at the angles of interest.

Figure 22G:
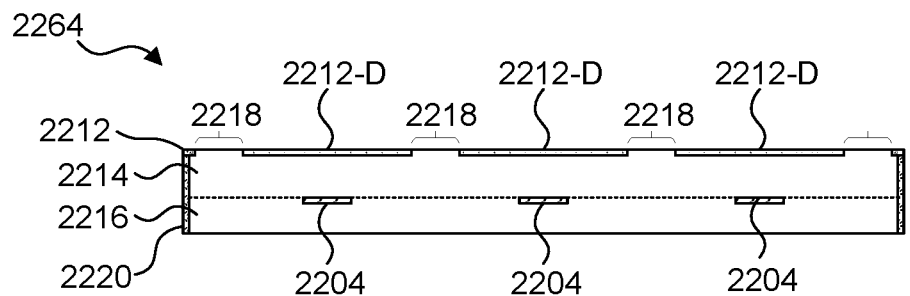
FIG. 22G illustrates a cross-sectional view of a photodiode including multiple photosensitive surfaces and a top light blocking layer with multiple merged apertures formed on a first layer in accordance with some embodiments of the disclosure.

FIG. 22G illustrates a cross-sectional view of photodiode 2264 including multiple photosensitive surfaces 2204 and top light blocking layer 2212 with multiple merged apertures 2218 formed on first layer 2214 in accordance with some embodiments of the disclosure. One inner mask baffle 2212-D on top light blocking layer 2212 can be formed above and extend beyond each photosensitive surface 2204. Each inner mask baffle 2212-D can be at least partially encircled by an outer mask portion of top light blocking layer 2212, except for where apertures 2218 are partially merged. FIG. 22G is similar to FIG. 22A, except that the example of FIG. 22G includes multiple photosensitive surfaces 2204, multiple inner mask baffles 2212-D, and multiple merged apertures 2218.

Figure 22H:
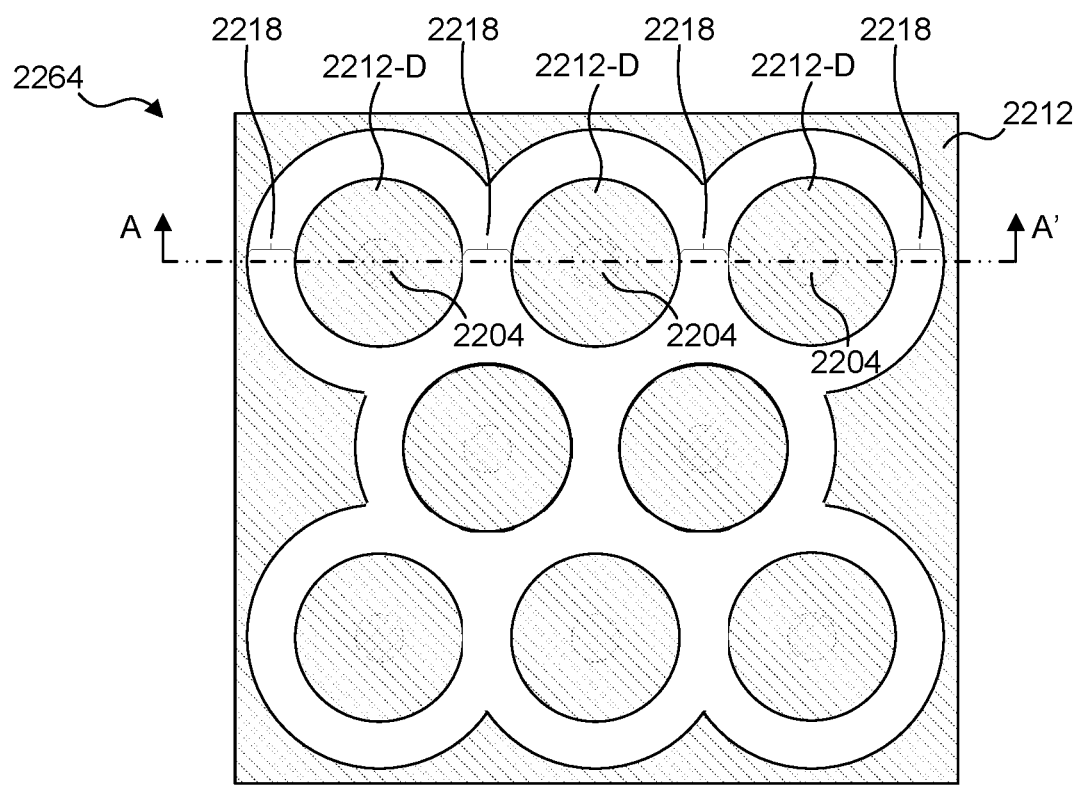
FIG. 22H illustrates a top view of the photodiode of FIG. 22G showing the top light blocking layer and the apertures in accordance with some embodiments of the disclosure.

FIG. 22H illustrates a top view of photodiode 2264 of FIG. 22G showing top light blocking layer 2212 and partially merged apertures 2218 in accordance with some embodiments of the disclosure. Note that the cross-sectional view of FIG. 22G is taken along the view A-A of FIG. 22H, and that photosensitive surfaces 2204 of FIG. 22H are shown as being hidden beneath inner mask baffles 2212-D. From the top view of FIG. 22H, it can be seen that ring-shaped apertures 2218 are merged together due to the close spacing of photosensitive surfaces 2204. In some instances, it can be advantageous to place multiple photosensitive surfaces 2204 as close together as practical to increase the amount of light detected by photodiode 2264, resulting in the overlap of apertures 2218 shown in FIG. 22H.

In some examples, the dimensions of photosensitive surfaces 2204, inner mask baffles 2212-D, and apertures 2218 can be the same within a single photodiode 2264. However, in other examples, the dimensions need not be the same. For example, FIG. 22H shows that due to the arrangement of photosensitive surfaces 2204 across photodiode 2264, there are some small open areas where no detection activity is taking place. Thus, although not shown in FIG. 22H, in some examples one or more smaller photosensitive surfaces and corresponding inner mask baffles and apertures can be formed in the open areas of photodiode 2264 to utilize those small areas for light detection.

Figure 22I:
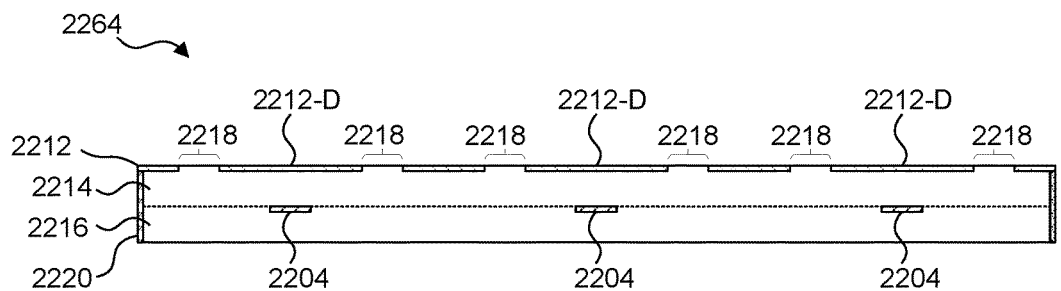
FIG. 22I illustrates a cross-sectional view of a photodiode including multiple photosensitive surfaces and a top light blocking layer with multiple separated apertures formed on a first layer in accordance with some embodiments of the disclosure.

FIG. 22I illustrates a cross-sectional view of photodiode 2264 including multiple photosensitive surfaces 2204 and top light blocking layer 2212 with multiple separated apertures 2218 formed on first layer 2214 in accordance with some embodiments of the disclosure. One inner mask baffle 2212-D on top light blocking layer 2212 can be formed above and extend beyond each photosensitive surface 2204. Each inner mask baffle 2212-D can be encircled by an outer mask portion of top light blocking layer 2212. FIG. 22I is similar to FIG. 22G, except that the example of FIG. 22I includes multiple separated apertures 2218.

Figure 22J:
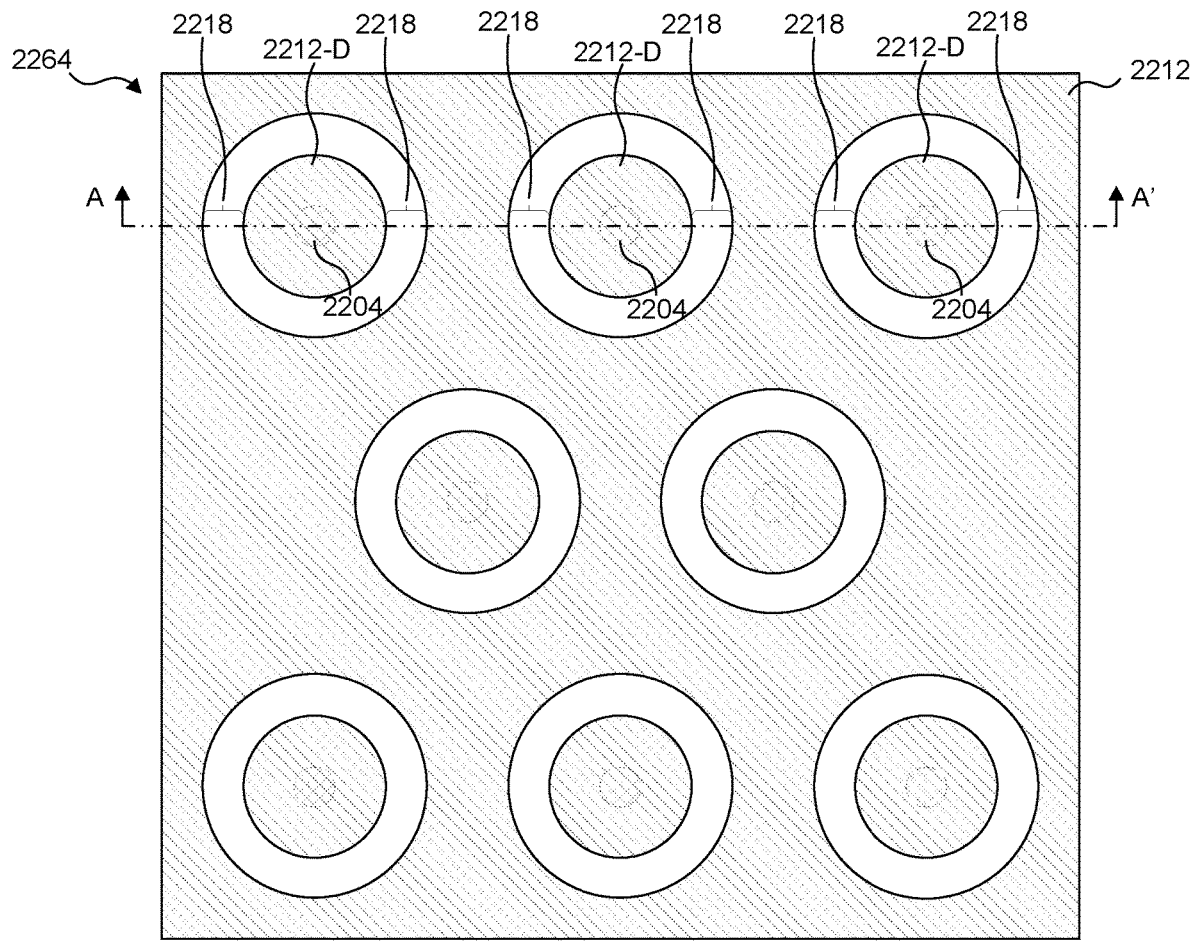
FIG. 22J illustrates a top view of the photodiode of FIG. 22I showing the top light blocking layer and the apertures in accordance with some embodiments of the disclosure.

FIG. 22J illustrates a top view of photodiode 2264 of FIG. 22I showing top light blocking layer 2212 and apertures 2218 in accordance with some embodiments of the disclosure. Note that the cross-sectional view of FIG. 22I is taken along the view A-A of FIG. 22J, and that photosensitive surfaces 2204 of FIG. 22J are shown as being hidden beneath inner mask baffles 2212-D. From the top view of FIG. 22J, it can be seen that ring-shaped apertures 2218 are separated due to the wider spacing of photosensitive surfaces 2204.

Figure 22K:
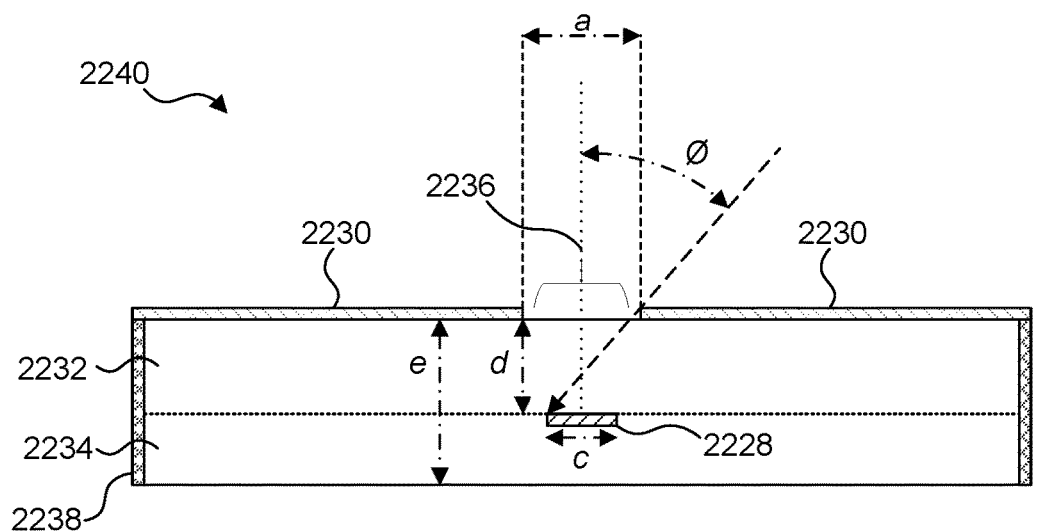
FIG. 22K illustrates a cross-sectional view of an LED including a photoemitting surface having a diameter c and a top light blocking layer formed on a first layer having a thickness d in accordance with some embodiments of the disclosure.

FIG. 22K illustrates a cross-sectional view of LED 2240 including photoemitting surface 2228 having a diameter c and top light blocking layer 2230 formed on first layer 2232 having a thickness d in accordance with some embodiments of the disclosure. First layer 2232 can be optically transparent, at least at the transmit wavelengths of interest. LED 2240 can include LED substrate or body 2234 and photoemitting surface 2228 located in a confined area on the LED substrate or body. LED body 2234 can include a p-type region and an n-type region that together form a semiconductor p-n junction, and can also include metal contacts for anode and cathode connections, most of which are not shown in FIG. 22K for purposes of simplifying the figure. Photoemitting surface 2228 can be created by blocking areas of LED body 2234 other than the area of the photoemitting surface using an opaque mask (not shown in FIG. 22K) formed over the LED body. The opaque mask can be formed from opaque material (e.g., metal) using masking, ion implantation, etc.

In the example of FIG. 22K, during the LED fabrication process, first layer 2232 can be formed over photoemitting surface 2228 and LED body 2234. In various examples, first layer 2232 can be a passivation or encapsulation layer deposited over photoemitting surface 2228 and LED body 2234, or alternatively the first layer can be an epoxy, a filter, or a grown oxide having a thickness of several microns.

An opaque mask layer such as top light blocking layer 2230 can then be formed over first layer 2232 during the LED component fabrication process and configured to define aperture 2236 to act as an angular filter and permit only certain angles of light to exit LED 2240. Top light blocking layer 2230 can be formed from opaque material (e.g., metal) using masking, ion implantation, etc. In some examples, top light blocking layer 2230 can allow only about 0.01% of received light to pass through. In some examples, top light blocking layer 2230 can also be absorptive, reflecting not more than about 1% of received light. Aperture 2236 can be created in areas of first layer 2232 that are not covered by light blocking layer 2230. Aperture 2236 can be formed above photoemitting surface 2228 (e.g., separated from the photoemitting surface by first layer 2232 in a vertical direction) in areas beyond the photoemitting surface (e.g., the edges of the aperture extend beyond the edges of the photoemitting surface in a horizontal direction). Although not shown in FIG. 22K, in some embodiments multiple apertures 2236 can be created in top light blocking layer 2230 to create multiple light emission points from a single photoemitting surface 2228. Note that FIG. 22K and its description herein may omit certain layers and assembly or fabrication processes for purposes of simplifying the disclosure.

As mentioned above, light rays with emission angles of less than +/−42 degrees from an LED surface normal can reduce the likelihood of emitted light rays producing unwanted reflections off the boundary between first layer 2232 and air or water above the first layer. Thus, aperture 2236 can be formed with a diameter a that permits only light with a range of emission angles +/−Ø to be emitted from LED 2240, such as within a specific number of degrees (e.g., within 10 degrees, 5 degrees, one degree, etc.) or some fixed percentage (e.g., within 20%, 10%, 5%, etc.) of +/−42 degrees. The diameter a of aperture 2236 can be computed as:

$$a = 2*d*\tan(\emptyset) - c \quad (11)$$

where c is the diameter of photoemitting surface 2228, and d is the thickness of first layer 2232. For optimal efficiency, a=c. Therefore:

$$a = d*\tan(\emptyset) \quad (12)$$

Table II below lists some example dimensions of LED 2240:

TABLE II

| Photoemitting Surface 2228 x-y Dimensions | LED thickness e |
| --- | --- |
| 5 μm × 5 μm | 2.5 μm to 5 μm |
| 10 μm × 10 μm | 2.5 μm to 5 μm |
| 20 μm × 20 μm | 2.5 μm to 5 μm |
| 40 μm × 40 μm | 2.5 μm to 5 μm |
| 40 μm × 80 μm | 2.5 μm to 5 μm |

In some examples, the maximum area of photoemitting surface 2228 can be limited to 50 μm×100 μm, and the photoemitting surface can be centered in the x dimension with respect to the package.

As described above, LEDs in close proximity to a photodiode can emit light that is intended to reflect off a touching or hovering object such as a stylus and back to the photodiode. In some examples, to ensure that light emitted from such proximate LEDs does not travel directly to the photodiode and be erroneously detected by the photodiode, LED 2240 can include side light blocking layers 2238 to block this stray light. Side light blocking layers 2238 can be formed from opaque material (e.g., metal) using masking, ion implantation, etc. In some examples, side light blocking layers 2238 can allow only about 0.01% of received light to pass through. In some examples, side light blocking layers 2238 can also be absorptive, reflecting not more than about 1% of received light.

Figure 22L:
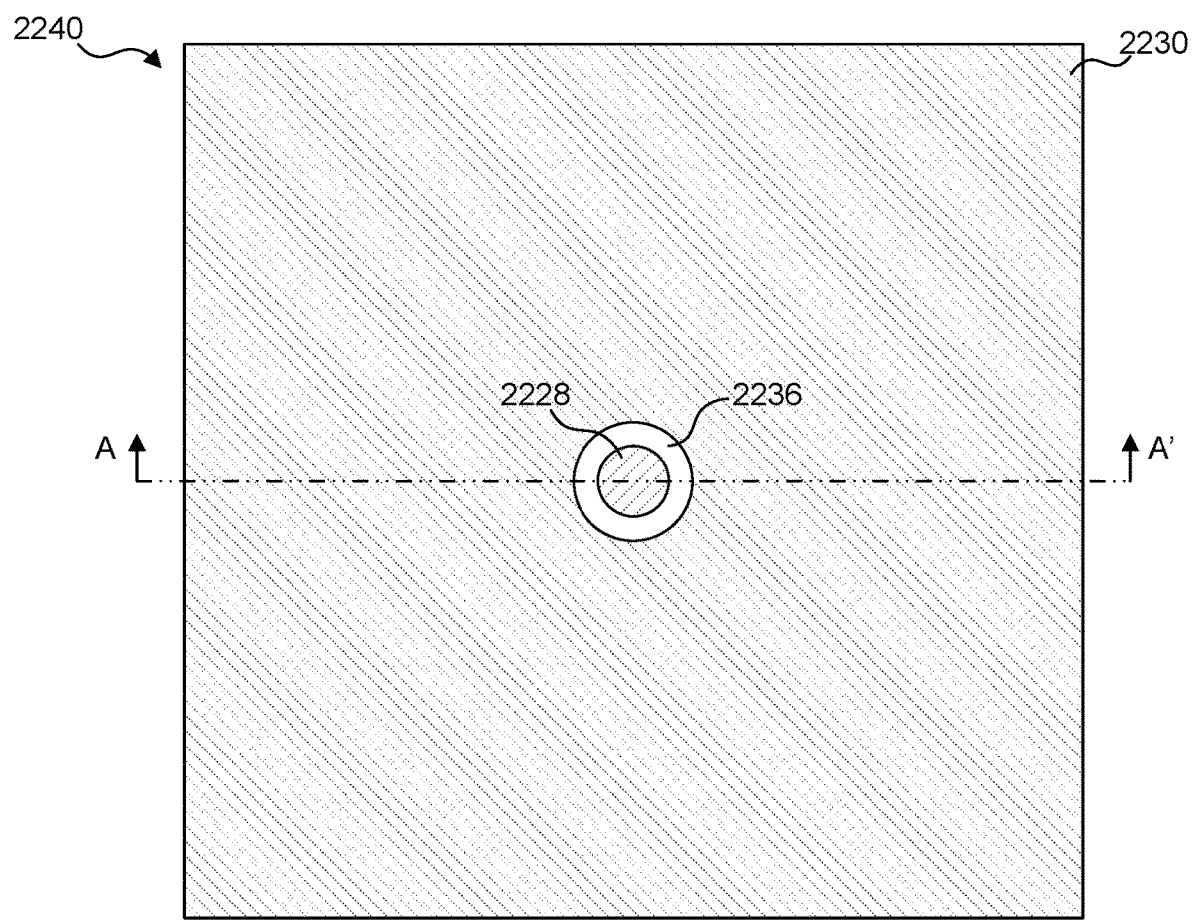
FIG. 22L illustrates a top view of the LED of FIG. 22K showing the top light blocking layer, an aperture, and a photoemitting surface in accordance with some embodiments of the disclosure.

FIG. 22L illustrates a top view of LED 2240 of FIG. 22K showing top light blocking layer 2230, aperture 2236, and photoemitting surface 2228 in accordance with some embodiments of the disclosure. Note that the cross-sectional view of FIG. 22K is taken along the view A-A of FIG. 22L.

In some examples, the photodiodes and LEDs having light blocking layers as discussed above can be formed such that there is one photodiode for every LED, but in other examples, different ratios of photodiodes and LEDs are contemplated. In addition, in some examples the photodiodes and LEDS can be arranged in a regular grid with a pitch of 1.25 mm, but in other examples a grid is not required. Also, although the preceding paragraphs describe the formation of light blocking layers either over the light detector (e.g. separate from the light detector component fabrication process; FIG. 16), or alternatively as an integral part of the photodiode or LED component level fabrication process (e.g., FIGS. 22A-22L), in other examples a combination can be employed, where one or more light blocking layers are formed at the photodiode or LED component level, and another light blocking layer is formed at the display assembly level.

Therefore, according to the above, some examples of the disclosure are directed to an electronic device configured to gather touch input from a finger, comprising a display having a display cover layer with a surface, wherein the surface has a surface normal, and an optical touch sensor comprising light sources configured to emit light into the display cover layer, wherein the light has a wavelength, light detectors that are configured to detect reflections of the light when the surface is contacted by the finger, and interference filters that are formed over at least one of the light detectors, wherein the interference filters have a first transmission for light at the wavelength and at a first incident angle relative to the surface normal, wherein the interference filters have a second transmission for light at the wavelength and at a second incident angle relative to the surface normal, wherein the second incident angle is greater than the first incident angle, and wherein the second transmission is greater than the first transmission. Additionally or alternatively to one or more of the examples disclosed above, in some examples the first incident angle is 0 degrees and wherein the second incident angle is greater than 65 degrees. Additionally or alternatively to one or more of the examples disclosed above, in some examples the display cover layer has a first refractive index, wherein water has a second refractive index, wherein an interface between a water droplet and the display cover layer has an associated critical angle based on the first refractive index and the second refractive index, and wherein the first incident angle is less than the critical angle. Additionally or alternatively to one or more of the examples disclosed above, in some examples the wavelength is a near infrared wavelength. Additionally or alternatively to one or more of the examples disclosed above, in some examples the electronic device further comprises additional interference filters that are formed over at least one of the light sources. Additionally or alternatively to one or more of the examples disclosed above, in some examples the additional interference filters have a third transmission for light at the wavelength and at a third incident angle relative to the surface normal, wherein the additional interference filters have a fourth transmission for light at the wavelength and at a fourth incident angle relative to the surface normal, wherein the fourth incident angle is greater than the third incident angle, and wherein the fourth transmission is less than the third transmission. Additionally or alternatively to one or more of the examples disclosed above, in some examples the display cover layer has a first refractive index, wherein air has a second refractive index, wherein an interface between air and the display cover layer has an associated critical angle based on the first refractive index and the second refractive index, and wherein the third incident angle is less than the critical angle. Additionally or alternatively to one or more of the examples disclosed above, in some examples each one of the additional interference filters comprises multiple sublayers with alternating index of refraction values. Additionally or alternatively to one or more of the examples disclosed above, in some examples each one of the interference filters comprises multiple sublayers with alternating index of refraction values. Additionally or alternatively to one or more of the examples disclosed above, in some examples each one of the interference filters comprises alternating layers of glass and silver. Additionally or alternatively to one or more of the examples disclosed above, in some examples each one of the interference filters comprises a first sublayer formed from glass, a second sublayer formed from silver, a third sublayer formed from glass, and a fourth sublayer formed from silver. Additionally or alternatively to one or more of the examples disclosed above, in some examples the second sublayer has a thickness of less than 100 nanometers, wherein the third sublayer has a thickness of less than 1,000 nanometers, and wherein the fourth sublayer has a thickness of less than 100 nanometers. Additionally or alternatively to one or more of the examples disclosed above, in some examples the electronic device further comprises additional filters, wherein each additional filter is adjacent to a respective interference filter and formed over a respective light detector. Additionally or alternatively to one or more of the examples disclosed above, in some examples the additional filters block visible light. Additionally or alternatively to one or more of the examples disclosed above, in some examples the additional filters have a same transmission at the first incident angle as at the second incident angle. Additionally or alternatively to one or more of the examples disclosed above, in some examples the optical touch sensor is configured to distinguish between when the surface is contacted by the finger and when the surface is contacted by a water droplet.

Some examples of the disclosure are directed to an electronic device configured to gather touch input from a finger, comprising a display having a display cover layer, and an optical touch sensor comprising light sources configured to emit light into the display cover layer, light detectors that are configured to detect reflections of the light when the surface is contacted by the finger, first interference filters, wherein each first interference filter overlaps a respective light source of the light sources, and second interference filters, wherein each second interference filter overlaps a respective light detector of the light detectors. Additionally or alternatively to one or more of the examples disclosed above, in some examples the display cover layer has a surface normal, wherein the first interference filters are configured to pass more light at an on-axis angle that is parallel to the surface normal than at an off-axis angle that is not parallel to the surface normal, and wherein the second interference filters are configured to pass more light at the off-axis angle than at the on-axis angle. Additionally or alternatively to one or more of the examples disclosed above, in some examples each one of the first and second interference filters comprises multiple sublayers with alternating index of refraction values.

Some examples of the disclosure are directed to an electronic device configured to gather touch input from a finger, comprising a display having a display cover layer, and an optical touch sensor comprising at least one light source configured to emit near-infrared light into the display cover layer, light detectors that are configured to detect reflections of the near-infrared light when the surface is contacted by the finger, interference filters, wherein each interference filter is formed over a respective light detector, wherein each one of the interference filters comprises multiple sublayers with alternating index of refraction values, and wherein each interference filter has different transmission of near-infrared light at different incident angles, and visible light blocking filters, wherein each visible light blocking filter is formed over a respective light detector.

Some examples of the disclosure are directed to a photodiode for performing optical object sensing, comprising a photodiode body including a first photosensitive surface having a first surface area, a first layer formed above the photodiode body, and a first light-blocking layer formed over the first layer, the first light-blocking layer including a first inner mask baffle and a first outer mask portion, the first inner mask baffle formed above and extending beyond the first photosensitive surface, and the first inner mask baffle and the first outer mask portion defining a first aperture therebetween, wherein the first aperture is configured as a first angular filter for allowing incoming light rays to impinge upon the first photosensitive surface at angles between a first receive angle and a second receive angle. Additionally or alternatively to one or more of the examples disclosed above, in some examples the first receive angle is 62.7 degrees from a photodiode surface normal. Additionally or alternatively to one or more of the examples disclosed above, in some examples the first aperture is annulus-shaped and encircles the first photosensitive surface from above. Additionally or alternatively to one or more of the examples disclosed above, in some examples the first layer is a wavelength selective filter configured to pass light within a predetermined range of wavelengths. Additionally or alternatively to one or more of the examples disclosed above, in some examples the photodiode further comprises one or more side light blocking layers formed on one or both sides of the photodiode, the one or more side light blocking layers configured to prevent light rays impinging on the one or both sides of the photodiode from reaching the first photosensitive surface. Additionally or alternatively to one or more of the examples disclosed above, in some examples the photodiode further comprises a second light-blocking layer formed within the first layer and between the first light-blocking layer and the first photosensitive surface, the second light blocking layer including a second inner mask baffle formed above and extending beyond the first photosensitive surface and a second outer mask portion, and the second inner mask baffle and the second outer mask portion defining a second aperture therebetween, wherein the second aperture is configured as a second angular filter for allowing the incoming light rays to impinge upon the first photosensitive surface at angles between the first receive angle and the second receive angle. Additionally or alternatively to one or more of the examples disclosed above, in some examples the first receive angle is 62.7 degrees from a photodiode surface normal. Additionally or alternatively to one or more of the examples disclosed above, in some examples the second aperture is annulus-shaped and encircles the first photosensitive surface from above. Additionally or alternatively to one or more of the examples disclosed above, in some examples the photodiode further comprises a second layer formed between the first layer and the photodiode body, and a second light-blocking layer formed over the second layer, the second light-blocking layer including a second inner mask baffle and a second outer mask portion, the second inner mask baffle formed above and extending beyond the first photosensitive surface, and the second inner mask baffle and the second outer mask portion defining a second aperture therebetween, wherein the second aperture is configured as a second angular filter for allowing the incoming light rays to impinge upon the first photosensitive surface at angles between the first receive angle and the second receive angle. Additionally or alternatively to one or more of the examples disclosed above, in some examples the first layer has a first refractive index and the second layer has a second refractive index different from the first refractive index, and the first and second refractive indices of the first and second layers are selected for allowing the incoming light rays to impinge upon the first photosensitive surface at angles between a third receive angle and a fourth receive angle, the third and fourth receive angles smaller that the first and second receive angles, respectively, with respect to a surface normal of the photodiode. Additionally or alternatively to one or more of the examples disclosed above, in some examples the second aperture is annulus-shaped and encircles the first photosensitive surface from above. Additionally or alternatively to one or more of the examples disclosed above, in some examples the photodiode further comprises one or more second photosensitive surfaces included in the photodiode body, the one or more second photosensitive surfaces having one or more second surface areas, and one or more second inner mask baffles and one or more second outer mask portions included in the first light-blocking layer, with one second inner mask baffle and one second outer mask portion pair associated with each second photosensitive surface, each second inner mask baffle formed above and extending beyond its associated second photosensitive surface, and each second inner mask baffle and second outer mask portion pair defining a second aperture therebetween, wherein each second aperture of a plurality of second apertures is configured as a second angular filter for allowing incoming light rays to impinge upon its associated second photosensitive surface at angles between the first receive angle and the second receive angle. Additionally or alternatively to one or more of the examples disclosed above, in some examples each second aperture is annulus-shaped and at least partially encircles its associated photosensitive surface from above. Additionally or alternatively to one or more of the examples disclosed above, in some examples the plurality of second apertures are partially merged. Additionally or alternatively to one or more of the examples disclosed above, in some examples an integrated touch screen includes the photodiode of one or more of the examples disclosed above.

Some examples of the disclosure are directed to a light emitting diode (LED) for performing optical object sensing, comprising an LED body including a first photoemitting surface having a first surface area, a first layer formed above the LED body, and a first light-blocking layer formed over the first layer, the first light-blocking layer defining a first aperture formed above and extending beyond the first photoemitting surface, wherein the first aperture is configured as a first angular filter for allowing light rays to be emitted from the first photoemitting surface and exit the LED at angles between a first light emission angle and a second light emission angle. Additionally or alternatively to one or more of the examples disclosed above, in some examples the first light emission angle is 42 degrees from an LED surface normal. Additionally or alternatively to one or more of the examples disclosed above, in some examples the LED further comprises one or more second apertures formed in the first light-blocking layer to create a plurality of light emission points for the first photoemitting surface. Additionally or alternatively to one or more of the examples disclosed above, in some examples the LED further comprises one or more side light blocking layers formed on one or both sides of the LED, the one or more side light blocking layers configured to prevent light rays emitted from the first photoemitting surface from exiting through the one or both sides of the LED. Additionally or alternatively to one or more of the examples disclosed above, in some examples an integrated touch screen includes the LED of one or more of the examples disclosed above.

The foregoing is merely illustrative and various modifications can be made to the described embodiments. The foregoing embodiments may be implemented individually or in any combination. Such modifications and combinations are to be understood as being included within the scope of examples of this disclosure as defined by the appended claims.

The invention claimed is:

1. An electronic device configured to gather touch input from a finger, comprising:
 a display having a display cover layer with a surface, wherein the surface has a surface normal; and
 an optical touch sensor comprising:
  light sources configured to emit light into the display cover layer, wherein the light has a wavelength;
  light detectors that are configured to detect reflections of the light when the surface is contacted by the finger; and
  interference filters that are formed over at least one of the light detectors, wherein the interference filters have a first transmission for light at the wavelength and at a first incident angle relative to the surface normal, wherein the interference filters have a second transmission for light at the wavelength and at a second incident angle relative to the surface normal, wherein the second incident angle is greater than the first incident angle, and wherein the second transmission is greater than the first transmission.

2. The electronic device defined in claim 1, wherein the first incident angle is 0 degrees and wherein the second incident angle is greater than 65 degrees.

3. The electronic device defined in claim 1, wherein the display cover layer has a first refractive index, wherein water has a second refractive index, wherein an interface between a water droplet and the display cover layer has an associated critical angle based on the first refractive index and the second refractive index, and wherein the first incident angle is less than the critical angle.

4. The electronic device defined in claim 1, wherein the wavelength is a near infrared wavelength.

5. The electronic device defined in claim 1, further comprising:
additional interference filters that are formed over at least one of the light sources.

6. The electronic device defined in claim 5, wherein the additional interference filters have a third transmission for light at the wavelength and at a third incident angle relative to the surface normal, wherein the additional interference filters have a fourth transmission for light at the wavelength and at a fourth incident angle relative to the surface normal, wherein the fourth incident angle is greater than the third incident angle, and wherein the fourth transmission is less than the third transmission.

7. The electronic device defined in claim 6, wherein the display cover layer has a first refractive index, wherein air has a second refractive index, wherein an interface between air and the display cover layer has an associated critical angle based on the first refractive index and the second refractive index, and wherein the third incident angle is less than the critical angle.

8. The electronic device defined in claim 5, wherein each one of the additional interference filters comprises multiple sublayers with alternating index of refraction values.

9. The electronic device defined in claim 1, wherein each one of the interference filters comprises multiple sublayers with alternating index of refraction values.

10. The electronic device defined in claim 1, wherein each one of the interference filters comprises alternating layers of glass and silver.

11. The electronic device defined in claim 10, wherein each one of the interference filters comprises:
a first sublayer formed from glass;
a second sublayer formed from silver;
a third sublayer formed from glass; and
a fourth sublayer formed from silver.

12. The electronic device defined in claim 11, wherein the second sublayer has a thickness of less than 100 nanometers, wherein the third sublayer has a thickness of less than 1,000 nanometers, and wherein the fourth sublayer has a thickness of less than 100 nanometers.

13. The electronic device defined in claim 1, further comprising:
additional filters, wherein each additional filter is adjacent to a respective interference filter and formed over a respective light detector.

14. The electronic device defined in claim 13, wherein the additional filters block visible light.

15. The electronic device defined in claim 13, wherein the additional filters have a same transmission at the first incident angle as at the second incident angle.

16. The electronic device defined in claim 1, wherein the optical touch sensor is configured to distinguish between when the surface is contacted by the finger and when the surface is contacted by a water droplet.

17. An electronic device configured to gather touch input from a finger, comprising:
a display having a display cover layer; and
an optical touch sensor comprising:
light sources configured to emit light into the display cover layer;
light detectors that are configured to detect reflections of the light when the cover layer is contacted by the finger;
first interference filters, wherein each first interference filter overlaps a respective light source of the light sources; and
second interference filters, wherein each second interference filter overlaps a respective light detector of the light detectors.

18. The electronic device defined in claim 17, wherein the display cover layer has a surface normal, wherein the first interference filters are configured to pass more light at an on-axis angle that is parallel to the surface normal than at an off-axis angle that is not parallel to the surface normal, and wherein the second interference filters are configured to pass more light at the off-axis angle than at the on-axis angle.

19. The electronic device defined in claim 17, wherein each one of the first and second interference filters comprises multiple sublayers with alternating index of refraction values.

20. An electronic device configured to gather touch input from a finger, comprising:
a display having a display cover layer; and
an optical touch sensor comprising:
at least one light source configured to emit near-infrared light into the display cover layer;
light detectors that are configured to detect reflections of the near-infrared light when the cover layer is contacted by the finger;
interference filters, wherein each interference filter is formed over a respective light detector, wherein each one of the interference filters comprises multiple sublayers with alternating index of refraction values, and wherein each interference filter has different transmission of near-infrared light at different incident angles; and
visible light blocking filters, wherein each visible light blocking filter is formed over a respective light detector.

* * * * *